United States Patent [19]
Kawai et al.

[11] Patent Number: 5,473,168
[45] Date of Patent: Dec. 5, 1995

[54] THIN FILM TRANSISTOR

[75] Inventors: Katsuhiro Kawai, Yamatotakada; Mikio Katayama, Ikoma, both of Japan

[73] Assignee: Sharp Kabushiki Kaisha, Japan

[21] Appl. No.: 233,805

[22] Filed: Apr. 26, 1994

[30] Foreign Application Priority Data

Apr. 30, 1993 [JP] Japan .................................. 5-104842
Apr. 30, 1993 [JP] Japan .................................. 5-127838

[51] Int. Cl.$^6$ .............................. H01L 29/78; H01L 27/12
[52] U.S. Cl. .................. 257/61; 257/66; 257/64; 257/72
[58] Field of Search .................. 257/61, 66, 64, 257/347, 365, 72, 62, 63

[56] References Cited

U.S. PATENT DOCUMENTS 5,122,849  6/1992  Tanaka et al. ......................... 257/61

FOREIGN PATENT DOCUMENTS 63-119577  5/1988  Japan ......................... 257/61
2-47633   2/1990  Japan ......................... 257/61
2-260460  10/1990  Japan ......................... 257/61
3-185840  8/1991  Japan ......................... 257/61

Primary Examiner—Donald L. Monin, Jr.
Attorney, Agent, or Firm—Nixon & Vanderhye

[57] ABSTRACT

The thin film transistor of the invention includes a substrate; a gate electrode formed on the substrate; a semiconductor layer insulated from the gate electrode, the semiconductor layer being formed on the substrate to cover the gate electrode; a first contact layer and a second contact layer which are made of n-type microcrystalline silicon having a resistivity of 10 Ωcm or less, the first and second contact layers being in contact with the semiconductor layer so as cover part of the gate electrode; a source electrode which is in contact with part of the first contact layer; and a drain electrode which is in contact with part of the second contact layer.

6 Claims, 20 Drawing Sheets

-6μm (3μm for each end)
Width Welect of the source electrode and the drain electrode (μm)

5,473,168

THIN FILM TRANSISTOR

BACKGROUND OF THE INVENTION

1. Field of the Invention

The present invention relates to a thin film transistor, and more specifically, relates to a thin film transistor suitably used as a switching element for selectively switching a pixel electrode for an active matrix liquid crystal display apparatus.

2. Description of the Related Art

FIG. 43 is a plan view of a first conventional thin film transistor (hereinafter, referred to as a TFT) used for an active matrix liquid crystal apparatus, and FIG. 44 is a sectional view of the TFT taken along the line X44—X44 of FIG. 43. Referring to FIGS. 43 and 44, the first conventional TFT includes a gate electrode 1, a gate insulating film 8, a semiconductor layer 7 made of amorphous silicon, an etching stopper layer 6, ohmic contact layers 4 and 5 made of a phosphorus-doped semiconductor, and source and drain electrodes 2 and 3. All of these layers are formed in this order on an insulating substrate 9. The TFT having the above structure is called an inverted staggered type transistor.

FIG. 45 is a plan view of a second conventional TFT, and FIG. 46 is a sectional view of the TFT taken along the line X46—X46 of FIG. 45. The second conventional TFT is also an inverted staggered type transistor though it does not include an etching stopper layer as in the first conventional TFT.

FIG. 47 is a plan view of a third conventional TFT, and FIG. 48 is a sectional view of the TFT taken along the line X48—X48 of FIG. 47. Referring to FIGS. 47 and 48, the third conventional TFT includes source and drain electrodes 2 and 3, ohmic contact layers 4 and 5 made of a phosphorus-doped semiconductor, a semiconductor layer 7 made of amorphous silicon, a gate insulating film 8, and a gate electrode 1. All of these layers are formed in this order on an insulating substrate 9. The TFT having the above structure is called a staggered type transistor. Besides the transistors of the above-described types, those having structures called a inverted coplanar type as well as a coplanar type have also been realized. FIGS. 49 and 50 show TFTs of the inverted coplanar type and the coplanar type, respectively.

All of the above conventional TFTs include the ohmic contact layers 4 and 5 made of amorphous silicon doped with phosphorus (hereinafter, referred to as a-Si(n⁺)). They also have overlap portions 10, as shown in FIG. 44 for example, where part of the source electrode 2 and part of the drain electrode 3 are located right above part of the gate electrode 1 with the gate insulating film 8 therebetween.

A case where the source electrode 2 and the drain electrode 3 do not overlap the gate electrode 1 is shown by two-dot dash lines in FIGS. 43 and 44. In this case, gaps 12 are formed between the source electrode 2 and the gate electrode 1 and between the drain electrode 3 and the gate electrode 1 (hereinafter, the gaps 12 are referred to as non-overlap portions). The non-overlap portions 12 produce a resistance of an influential level which is connected in series with a resistance at the channel portion 42 when the TFT is activated. Hereinafter, the former resistance is referred to as a series resistance and the latter resistance is referred to as an ON resistance. The series resistance lowers the current-voltage characteristic of the TFT.

To prevent the production of the series resistance, the source electrode 2 and the drain electrode 3 should be formed so as to overlap the gate electrode 1. In practice, the patterns of electrodes are designed so that a sufficient margin for possible deviations of the patterns in a mask alignment of the photolithographic process. As a result, the areas of the overlap portions 10 become greater than the minimum requirement, and thus the size of the resultant TFT, that is, the area occupied by the TFT increases.

Meanwhile, when the source electrode 2 and the drain electrode 3 are formed to overlap the gate electrode 1 or the gate electrode 1 is formed to overlap the source electrode 2 and the drain electrode 3, a parasitic capacitance is produced between the source electrode 2 and the gate electrode 1 and between the drain electrode 3 and the gate electrode 1. Such a parasitic capacitance causes the generation of a direct-current component for the voltage applied to the pixel electrode. As a result, troubles such as after images and flickering occur, and thus the quality of the image deteriorates. In order to minimize the production of the parasitic capacitance, the areas of the overlap portions 10 should be minimized by, for example, reducing the sizes of the electrodes. However, according to the conventional techniques, since the margin for the deviation of the patterns is required as described above, it is difficult to reduce the areas of the overlap portions 10.

As shown in FIG. 43, a width $W_{elect}$ of the source electrode 2 and the drain electrode 3 is almost the same as a width $W_{cont}$ of the contact layers 4 and 5. The semiconductor layer 7 also has a width substantially the same as the width $W_{cont}$ of the contact layers 4 and 5, because the semiconductor layer 7 is etched together with the contact layers 4 and 5. A channel width W of the TFT is determined by the width $W_{cont}$ of the contact layers 4 and 5. When the width $W_{elect}$ of the source electrode 2 and the drain electrode 3 is made smaller than the width $W_{cont}$ of the contact layers 4 and 5, the effective channel width $W_{rms}$ becomes smaller. The effective channel width $W_{rms}$ is obtained by a current flowing through the TFT when the TFT is activated (hereinafter, referred to as an ON current). When the effective channel width $W_{rms}$ is smaller, the ON resistance of the TFT is greater, and thus the performance of the TFT is lowered. It is not practical, therefore, to make the width $W_{elect}$ of the source electrode 2 and the drain electrode 3 significantly smaller than the width $W_{cont}$ of the contact layers 4 and 5. Accordingly, it is not possible to reduce the areas of the overlap portions 10 by reducing the width $W_{elect}$ of the source electrode 2 and the drain electrode 3.

For the above reasons, the conventional TFTs are disadvantageous in that they cannot be reduced in size and their response characteristic is restrictive because of the production of the parasitic capacitance.

SUMMARY OF THE INVENTION

The thin film transistor of this invention, includes a substrate; a gate electrode formed on the substrate; a semiconductor layer insulated from the gate electrode, the semiconductor layer being formed on the substrate to cover the gate electrode; a first contact layer and a second contact layer which are made of n-type microcrystalline silicon having a resistivity of 10 Ωcm or less, the first and second contact layers being in contact with the semiconductor layer to cover part of the gate electrode; a source electrode which is in contact with part of the first contact layer; and a drain electrode which is in contact with part of the second contact layer.

In one embodiment of the invention, at least one of the source and drain electrodes is disposed not to overlap the gate electrode.

In another embodiment of the invention, the source electrode covers part of the first contact layer, and the drain electrode covers part of the second contact layer.

In another embodiment of the invention, the source and drain electrodes are formed directly on the substrate, part of the first contact layer covering the source electrode, and part of the second contact layer covering the drain electrode.

In another embodiment of the invention, a width in a channel width direction of at least one of the source and drain electrodes is smaller than a width in the channel width direction of the first and second contact layers.

In another embodiment of the invention, the width in the channel width direction of the at least one of the source and drain electrodes is determined so that an end of the at least one of the source and drain electrodes is located apart from an end of a corresponding one of the first and second contact layers by a distance of 3 μm or more.

In another embodiment of the invention, the source electrode and the drain electrode are formed at positions displaced from each other in the channel width direction.

In another embodiment of the invention, the gate electrode includes a first portion and a second portion, the first portion having a first width in a channel length direction, and the second portion having a second width in the channel length direction which is smaller than the first width.

In another embodiment of the invention, the source electrode and the drain electrode cover part of the first portion of the gate electrode.

In another embodiment of the invention, each of the source and drain electrodes includes a first portion and a second portion, the first portion having a first width in a channel width direction, the second portion having a second width in the channel width direction which is larger than the first width, and wherein the first portion partially covers the gate electrode.

According to another aspect of the invention, the thin film transistor includes a substrate; a source electrode and a drain electrode both formed on the substrate; a first contact layer and a second contact layer which are made of n-type microcrystalline silicon having a resistivity of 10 Ωcm or less, the first contact layer being in contact with part of the source electrode, and the second contact layer being in contact with part of the drain electrode; a semiconductor layer which is in contact with the first and second contact layers; and a gate electrode insulated from the semiconductor layer, the gate electrode covering part of the first contact layer and part of the contact layer.

In one embodiment of the invention, the gate electrode is disposed not to overlap at least one of the source and drain electrodes.

In another embodiment of the invention, the first contact layer covers part of the source electrode, and the second contact layer covers part of the drain electrode.

In another embodiment of the invention, the semiconductor layer is formed directly on the substrate, the first and second contact layers are formed directly on the semiconductor layer, and the source electrode and the drain electrode are formed to cover part of the first contact layer and part of the second contact layer, respectively.

In another embodiment of the invention, a width in a channel width direction of at least one of the source and drain electrodes is smaller than a width in the channel width direction of the first and second contact layers.

In another embodiment of the invention, the first contact layer covers part of the source electrode, and the second contact layer covers part of the drain electrode.

In another embodiment of the invention, the semiconductor layer is formed directly on the substrate, the first and second contact layers are formed directly on the semiconductor layer, and the source electrode and the drain electrode are formed to cover part of the first contact layer and part of the second contact layer, respectively.

Thus, the invention described herein makes possible the advantage of providing a thin film transistor of a small size with much improved reliability and response property.

This and other advantages of the present invention will become apparent to those skilled in the art upon reading and understanding the following detailed description with reference to the accompanying figures.

DESCRIPTION OF THE PREFERRED EMBODIMENTS

EXAMPLE 1

Figure 1:
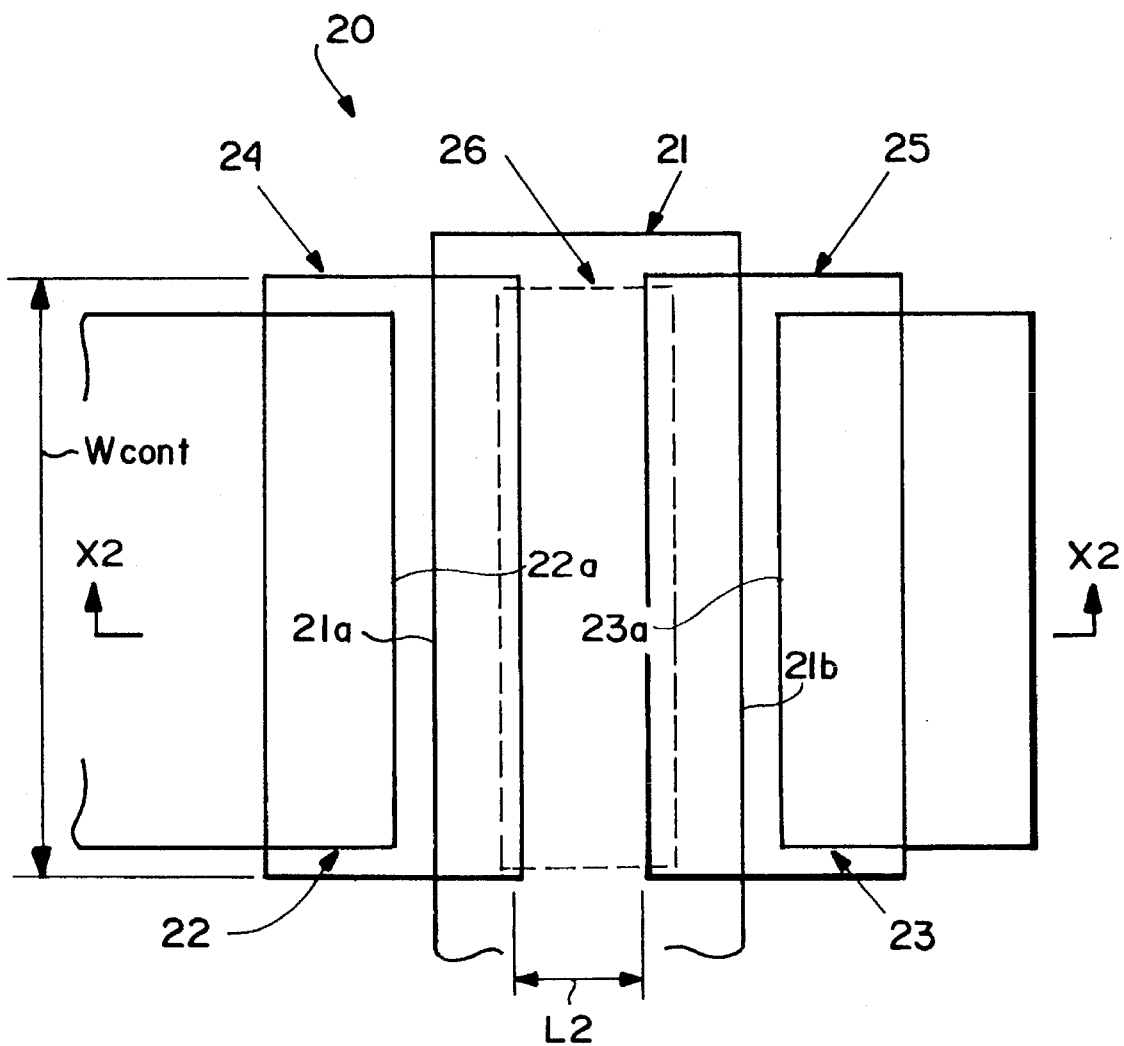
FIG. 1 is a plan view of a TFT of a first example according to the present invention.
Figure 2:
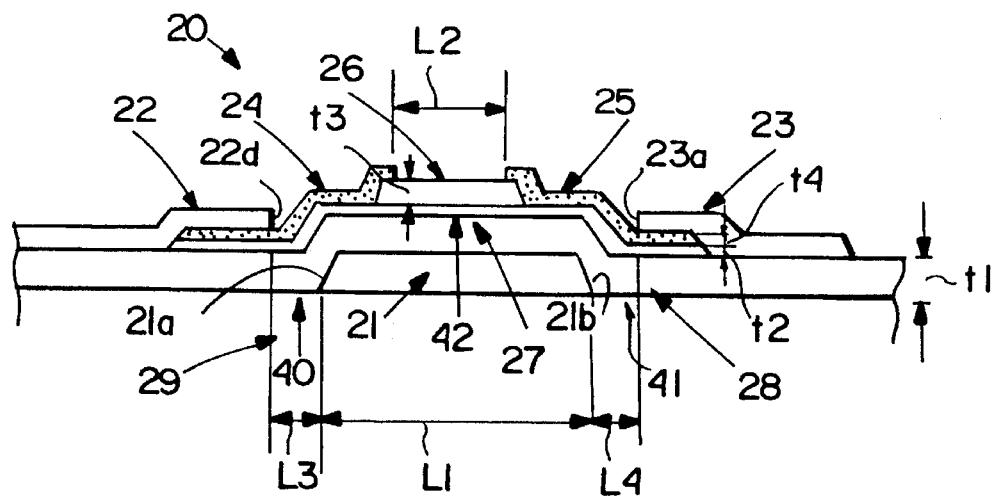
FIG. 2 is a sectional view of the TFT of the first example taken along line X2—X2 of FIG. 1.
Figure 3:
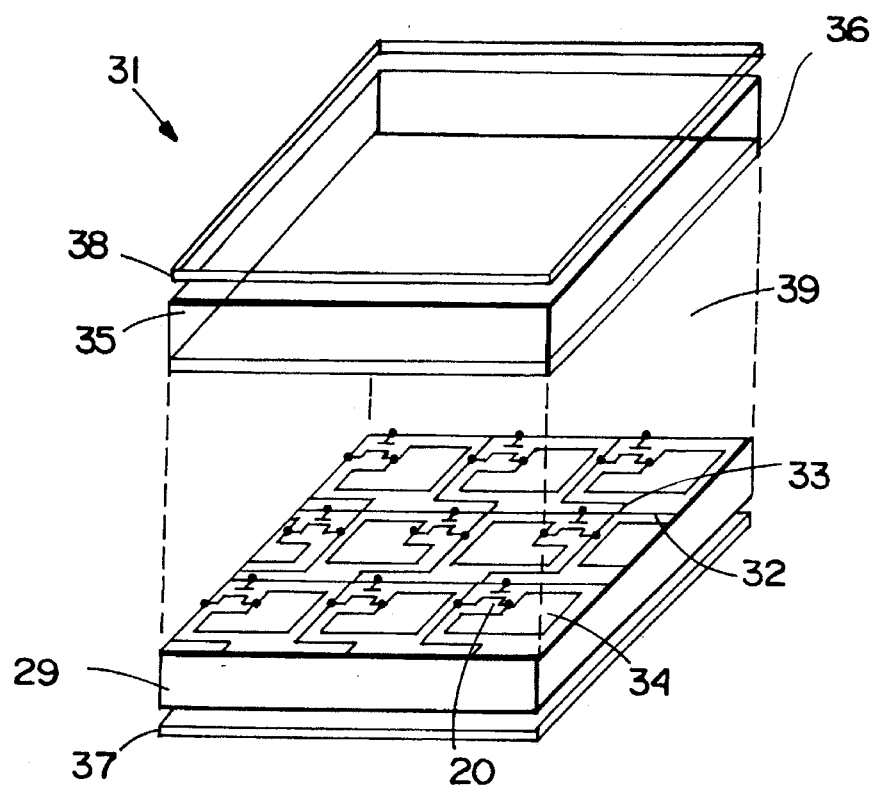
FIG. 3 is an exploded perspective view of a liquid crystal display apparatus using a TFT according to the present invention.

FIG. 1 is a plan view of a TFT 20 of the first example according to the present invention, and FIG. 2 is a sectional view of the TFT 20 taken along the line X2—X2 in FIG. 1. FIG. 3 is an exploded perspective view of an active matrix liquid crystal display apparatus 31 (hereinafter, simply referred to as an LC display apparatus) in which a plurality of such TFTs 20 of this example are used as switching elements. In this example, the TFT 20 is an inverted staggered type TFT having an etching stopper.

Referring to FIG. 3, the LC display apparatus 31 includes an insulating substrate 29 made of glass or the like. A plurality of gate lines 32 running in parallel with each other, and a plurality of source lines 33 crossing the respective gate lines 32 are formed on the insulating substrate 29. Pixel electrodes 34 are disposed at positions adjacent to the respective crossings of the gate lines 32 and the source lines 33, thus forming a matrix on the insulating substrate 29. The pixel electrodes 34 are connected to the gate lines 32 and the source lines 33 through the TFTs 20 of this example as the switching elements.

The LC display apparatus 31 further includes an insulating substrate 35 made of glass or the like, which is disposed so as to oppose the insulating substrate 29. A counter electrode 36 is formed on the inner surface of the insulating substrate 35. The insulating substrates 29 and 35 are attached together with liquid crystal contained therebetween, thus forming a liquid crystal layer 39 interposed between the pixel electrodes 34 and the counter electrode 36. To the outer surfaces of the thus attached insulating substrates 29 and 35 polarizing plates 37 and 38 adhere.

Referring to FIGS. 1 and 2, the TFT 20 of this example includes a gate electrode 21 made of a metal material, a gate insulating film 28, a semiconductor layer 27 made of intrinsic amorphous silicon, an etching stopper layer 26, ohmic contact layers 24 and 25 made of phosphorus-doped $n^+$-type microcrystalline silicon, and source and drain electrodes 22 and 23 made of a metal material. All of these layers are formed in this order on an insulating substrate 29 made of glass or the like.

The method for fabricating the TFT 20 of this example will be described with reference to FIGS. 1 and 2:

First, a conductive film made of a material with a small resistivity such as Al, Ti, and Ta is formed on the insulating substrate 29. In this example, Ta was deposited on the insulating substrate 29 made of glass to a thickness of 300 nm by sputtering. Then, the conductive film is patterned to a desired shape, forming the gate electrode 21 having a width L1 in the channel length direction. In this example the width L1 is 9 μm. On the thus-formed gate electrode 21 are formed the gate insulating film 28, the semiconductor layer 27, and the etching stopper layer 26 in this order to thicknesses t1, t2, and t3, respectively. In this example, $SiN_x$ was first deposited to a thickness of approximately 300 nm covering the gate electrode 21, so as to form the gate insulating film 28. Thereafter intrinsic amorphous silicon (hereinafter referred to as a-Si(i)) was deposited to a thickness of 30 nm, and then $SiN_x$ was again deposited to a thickness of 200 nm. Plasma CVD (chemical vapor deposition) was used for the above series of deposition. The latter $SiN_x$ layer was then patterned to form the etching stopper layer 26.

Then, phosphorus-doped $n^+$-type microcrystalline silicon (hereinafter, referred to as μc-Si($n^+$)) is deposited to a thickness t4 by plasma CVD, for example, in an atmosphere of monosilane, phosphine, and hydrogen at a flow ratio of 1:1:100 with power higher than that conventionally used. In this example the deposition of μc-Si($n^+$) was conducted under the conditions of the substrate temperature of 260° C., the power density of 0.05 W/cm$^2$ and the pressure of 110 Pa so as to form the μc-Si(n$^+$) layer having a thickness of t4=50 nm.

The thus formed a-Si(i) layer and the μc-Si(n$^+$) layer are patterned together to form the semiconductor layer 27 and the contact layers 24 and 25, respectively. The contact layers 24 and 25 have a width Wcont in the channel width direction and are kept apart from each other by the distance L2 in the channel length direction. The portion of the semiconductor layer 27 between the contact layers 24 and 25 is defined as a channel region 42. In this example, Wcont and L2 were set to be 40 μm and 4 μm, respectively. By the existence of the contact layers 24 and 25 made of μc-Si(n$^+$), it is possible to obtain a favorable ohmic contact between the semiconductor layer 27 and the source electrode 22 or the drain electrode 23. Further, the contact layers 24 and 25 have a conductivity of a hundred to a thousand times higher than contact layers made of n$^+$-type amorphous silicon used for the conventional TFTs. For example, the resistivity of n$^+$-type amorphous silicon is in the order of 1000 Ωcm, while μc-Si(n$^+$) is less than 10 Ωcm. This indicates that the contact layers 24 and 25 of this example can be considered to be substantially the same as the electrodes 22 and 23.

Thereafter, metal is deposited over the entire top surface of the substrate. The deposited metal layer is then patterned to a desired shape so as to form the source electrode 22 and the drain electrode 23. Metal having a small resistivity such as Ti, Al, Cr, and Mo which makes a good ohmic contact with pixel electrodes made of ITO is used for this layer. In this example, Ti was deposited to a thickness of 300 nm by sputtering, and the deposited Ti layer was patterned so that no portions of the source electrode 22 and the drain electrode 23 are located directly above the gate electrode 21.

More specifically, the source electrode 22 and the drain electrode 23 are formed so as to partly cover the semiconductor layer 27 and the contact layers 24 and 25. Ends 22a and 23a of the source electrode 22 and the drain electrode 23 closer to the gate electrode 21 are kept apart from the ends 21a and 21b of the gate electrode 21 by distances L3 and L4, respectively. Thus, non-overlap portions 40 and 41 are formed between the end 22a of the source electrode 22 and the end 21a of the gate electrode 21 and between the end 23a of the drain electrode 23 and the end 21b of the gate electrode 21, respectively. In this example, the source electrode 22 and the drain electrode 23 were formed so as to satisfy L3=2 μm and L4=2 μm, respectively.

If μc-Si(n$^+$) used for the contact layers 24 and 25 is replaced with a-Si(n$^+$) as in the conventional TFTs, the portions of the a-Si(n$^+$) layers ranging from the ends of the channel region 42 to the start of the overlap with the source electrode 22 and the drain electrode 23, i.e., the portions corresponding to the non-overlap portions 40 and 41, respectively, produce a series resistance connected with the ON resistance of the TFT 20. This results in restricting the flow of a current between the source electrode 22 and the drain electrode 23. Thus, it is difficult to obtain an ON current of a predetermined level for the TFT 20.

On the other hand, in this example, since the contact layers 24 and 25 are made of μc-Si(n$^+$), the resistance at the non-overlap portions 40 and 41 is sufficiently small compared with the ON resistance of the TFT 20. As a result, a response characteristic as good as in the conventional TFTs can be obtained though, in this example, unlike the conventional TFTs, the source electrode 22 and the drain electrode 23 do not overlap the gate electrode 21.

As described above, the source electrode 22 and the drain electrode 23 do not overlap the gate electrode 21 as long as they overlap the contact layers 24 and 25, respectively. Accordingly, in the mask alignment for patterning the source and drain electrodes, it is unnecessary to ensure a margin of deviation for the patterns. This makes it possible to fabricate the smaller TFT even if the amount of the deviation of the patterns is the same as that of the conventional TFT. As a result, the production of the parasitic capacitance can be minimized, and the response characteristic of the TFT be improved.

As described above, according to the TFT 20 of this example, the contact layers 24 and 25, which are made of μc-Si(n$^+$) having a resistivity of 10 Ωcm or less, act as part of the source electrode 22 and the drain electrode 23. Therefore, the portions of the contact layers 24 and 25 corresponding to the non-overlap portions 40 and 41 are prevented from producing a series resistance with the ON resistance of the TFT 20. This eliminates the necessity of providing an allowance for a possible deviation of patterns in the photolithographic process for patterning the metal layer to form the source electrode 22 and the drain electrode 23. As a result, the size (the occupying area) of the TFT 20 can be reduced.

EXAMPLE 2

Figure 4:
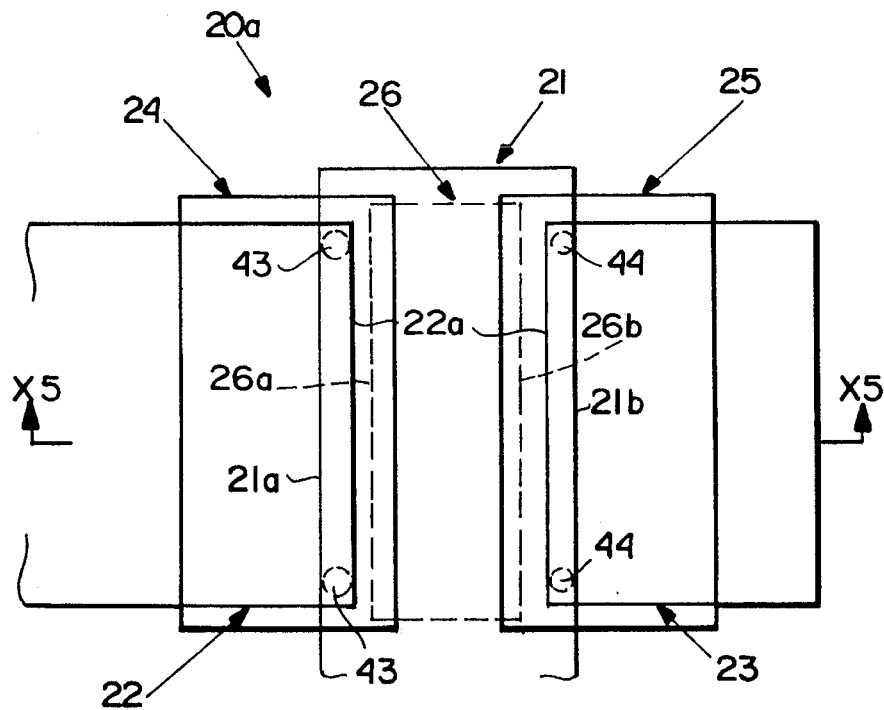
FIG. 4 is a plan view of a TFT of a second example according to the present invention.
Figure 5:
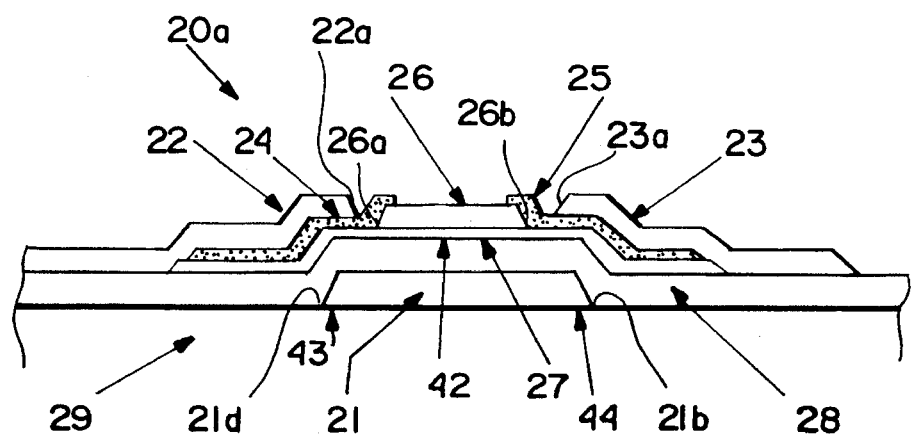
FIG. 5 is a sectional view of the TFT of the second example taken along line X5—X5 of FIG. 4.

FIG. 4 is a plan view of a TFT 20a of the second example according to the present invention, and FIG. 5 is a sectional view of the TFT 20a taken along the line X5—X5 of FIG. 4. This example resembles FIG. 1, and the same reference numerals denote the same or similar components to those in Example 1. The TFT 20a of this example is different from the TFT 20 of Example 1 in that a source electrode 22 and a drain electrode 23 overlap a gate electrode 21 but do not overlap an etching stopper layer 26. More specifically, when viewed from the top as in FIG. 4, the end 22a of the source electrode 22 is located between the end 21a of the gate electrode 21 and the end 26a of the etching stopper layer 26. Likewise, the end 23a of the drain electrode 23 is located between the end 21b of the gate electrode 21 and the end 26b of the etching stopper layer 26.

In this example, a deviation of patterns in the channel length direction may occur at the patterning of a metal layer for forming the source electrode 22 and the drain electrode 23, and thus the source electrode 22 and the drain electrode 23 may not overlap the gate electrode 21. In such a case, however, since the contact layers 24 and 25 are made of μc-Si(n$^+$) as in Example 1, the portions of the contact layers 24 and 25 corresponding to the gaps between the source electrode 22 and the gate electrode 21 and between the drain electrode 23 and the gate electrode 21, respectively, do not produce a series resistance connected with the ON resistance. This eliminates the necessity of taking into account the deviation of patterns in the photolithographic process for patterning the metal layer, and as a result, the size of the TFT 20a can be reduced.

In the process for testing the characteristics of the TFT after the fabrication process, a short-circuit or disconnection may be found in the TFT. In such a defect TFT, the gate electrode and the source electrode or the drain electrode may be short-circuited, for example, to make a resultant pixel defect less visible. In the TFT 20a of this example, unlike the TFT 20 of Example 1, the source electrode 22 and the drain electrode 23 overlap the gate electrode 21. Accordingly, it is easier to conduct a laser melt treatment where an overlap portion 43 of the source electrode 22 with the gate electrode 21 and an overlap portion 44 of the drain electrode 23 with the gate electrode 21 are irradiated with a laser beam so as to effect the short-circuit. This improves the reliability and the usability of the TFT.

EXAMPLE 3

Figure 6:
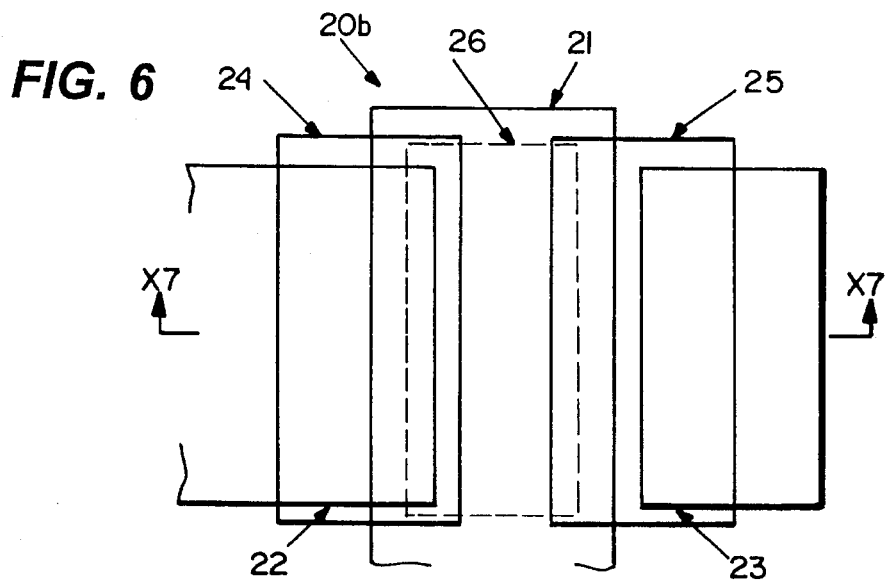
FIG. 6 is a plan view of a TFT of a third example according to the present invention.
Figure 7:
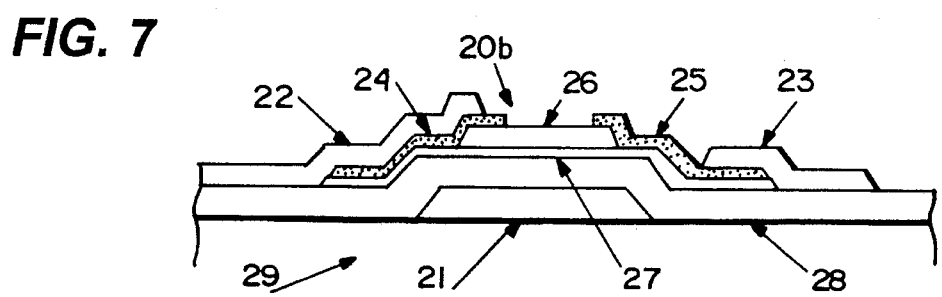
FIG. 7 is a sectional view of the TFT of the third example taken along line X7—X7 of FIG. 6.

FIG. 6 is a plan view of a TFT 20b of the third example according to the present invention, and FIG. 7 is a sectional view of the TFT 20b taken along the line X7—X7 of FIG. 6. This example resembles Examples 1 and 2, and the same reference numerals denote the same or similar components to those in Examples 1 and 2. The TFT 20b of this example is different from those of previous examples in that the source electrode 22 overlaps both the gate electrode 21 and the etching stopper layer 26, while the drain electrode 23 neither overlaps the gate electrode 21 nor the etching stopper layer 26. The TFT 20b with the above structure can also be reduced in size as in previous examples.

Thus, in this example, either the source electrode 22 or the drain electrode 23 overlaps the gate electrode 21 so that the laser melt treatment can be conducted between the source electrode 22 and the gate electrode 21, or between the drain electrode 23 and the gate electrode 21, as required, in the testing process after the fabrication process. As a result, the gate electrode 21 and the source electrode 22 or the drain electrode 23 can be easily short-circuited.

EXAMPLE 4

Figure 8:
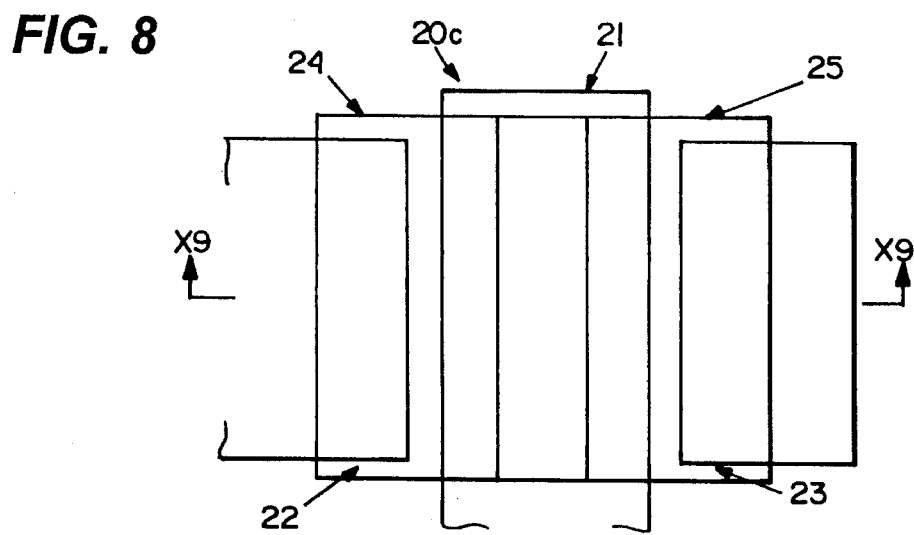
FIG. 8 is a plan view of a TFT of a fourth example according to the present invention.
Figure 9:
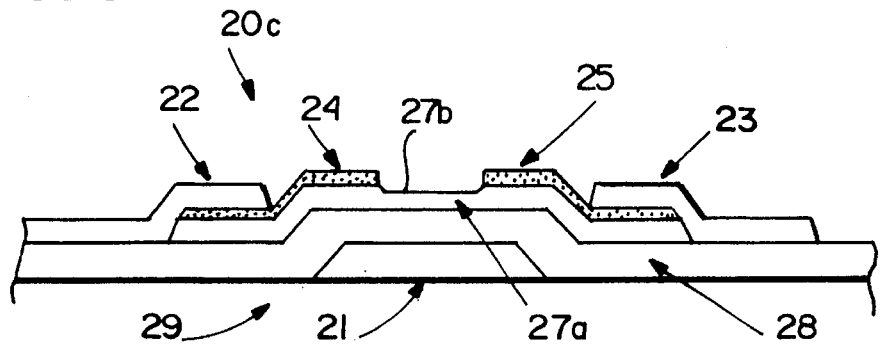
FIG. 9 is a sectional view of the TFT of the fourth example taken along line X9—X9 of FIG. 8.

FIG. 8 is a plan view of a TFT 20c of the fourth example according to the present invention, and FIG. 9 is a sectional view of the TFT 20c taken along the line X9—X9 of FIG. 8. In this example, the same reference numerals denote the same or similar components to those in previous examples. Unlike the previous examples, the TFT 20c of this example does not include an etching stopper layer. In general, the etching stopper layer is formed to prevent a channel region of a semiconductor layer from being etched by an etchant at the patterning for forming ohmic contact layers. In this example, instead of forming an etching stopper layer, the thickness of the semiconductor layer 27a is made thicker than that of the semiconductor layer 27 of the previous examples. More precisely, the thickness of the semiconductor layer 27a is determined so that the portion 27b thinned by being etched at the patterning for forming ohmic contact layers 24 and 25 can have a thickness large enough to allow the portion 27b to function as a channel region 42 of the TFT 20c. In this example, the thickness of the semiconductor layer 27a was 100 nm. The thicknesses of the contact layers 24 and 25, the source electrode 22, the drain electrode 23, and other layers are the same as those in the previous examples.

Since the contact layers 24 and 25 of this example are made of μc-Si(n$^+$) doped with phosphorus as in Example 1, they can be considered to be substantially the same as the source electrode 22 and the drain electrode 23. Accordingly, as in Example 1, the source electrode 22 and the drain electrode 23 can be formed at positions not overlapping the gate electrode 21. As a result, the same effect as that described in Example 1 can be obtained.

In FIGS. 8 and 9, the source electrode 22 and the drain electrode 23 are formed at positions not overlapping the gate electrode 21. The same effect can also be obtained when the source electrode 22 and the drain electrode 23 are formed at positions overlapping the gate electrode 21 as in Example 2. In this case, as in Example 2, the laser melt treatment can be easily conducted. More specifically, when a short-circuit or disconnection is found in the TFT 20c, the overlap portions of the source electrode 22 and the drain electrode 23 with the gate electrode 21 may be irradiated with a laser beam so as to short-circuit the source electrode 22 and the drain electrode 23 and thus make a defect pixel less visible.

The same effect can also be obtained when either the source electrode 22 or the drain electrode 23 is formed at a position overlapping the gate electrode 21 as in Example 3.

EXAMPLE 5

Figure 10:
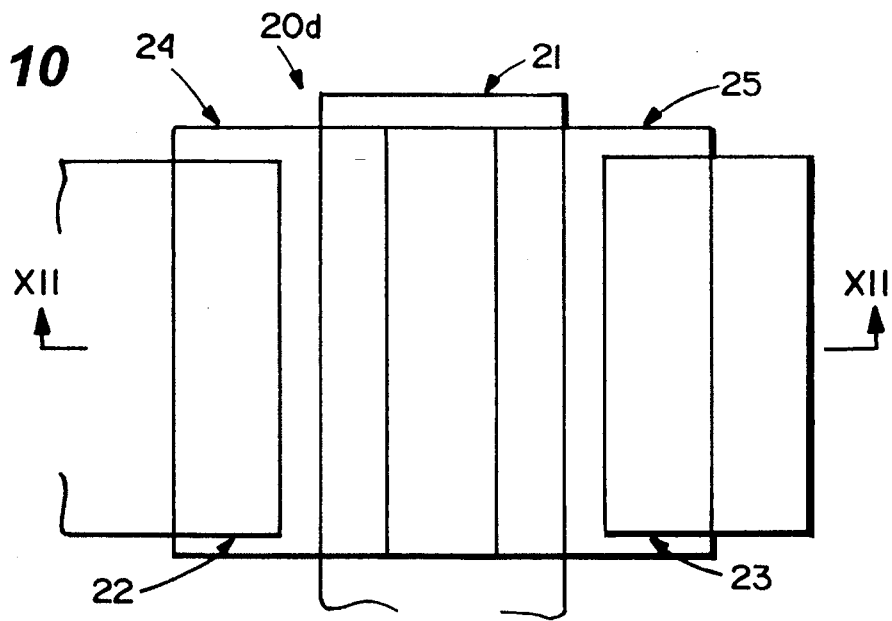
FIG. 10 is a plan view of a TFT of a fifth example according to the present invention.
Figure 11:
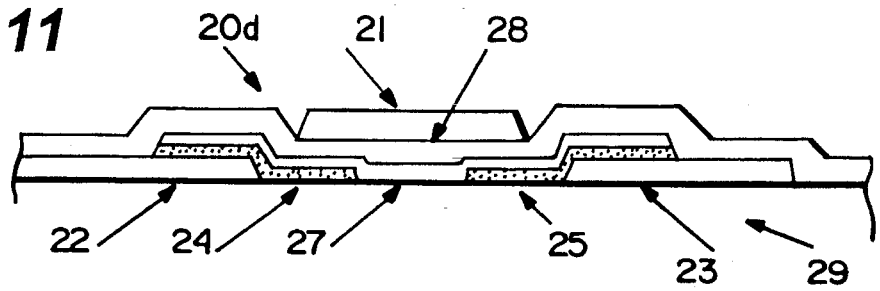
FIG. 11 is a sectional view of the TFT of the fifth example taken along line X11—X11 of FIG. 10.

FIG. 10 is a plan view of a TFT 20d of the fifth example according to the present invention, and FIG. 11 is a sectional view of the TFT 20d taken along the line X11—X11 of FIG. 10. In this example, the same reference numerals denote the same or similar components to those in previous examples. The TFT 20d of this example is a staggered type transistor, and includes source and drain electrodes 22 and 23, ohmic contact layers 24 and 25 made of μc-Si(n$^+$), a semiconductor layer 27 made of a-Si(i), a gate insulating film 28, and a gate electrode 21. These layers are formed in this order on an insulating substrate 29.

The method for fabricating the TFT 20d of this example will be described with reference to FIG. 11 as follows:

First, metal such as Ti, Al, Cr, and Mo is deposited on the insulating substrate 29. The deposited metal layer is then patterned to a desired shape so as to form the source electrode 22 and the drain electrode 23. In this example, Ti was deposited to a thickness of 300 nm. Thereafter, μc-Si(n$^+$) having a resistivity of 10 Ωcm or less was deposited to a thickness of 50 nm by plasma CVD to form the ohmic contact layers 24 and 25, and then a-Si(i) was deposited to a thickness of 30 nm to form the semiconductor layer 27. SiN$_x$ was then deposited over the entire top surface of the substrate to a thickness of 300 nm to form the gate insulating film 28, on which Al was deposited to a thickness of 200 nm by sputtering. The thus-deposited Al layer was patterned to form the gate electrode 21 at a position overlapping neither the source electrode 22 nor the drain electrode 23. In this example, Al was used as the material for the gate electrode 21. However, other material such as Cr and Mo having a small resistivity can also be used.

Since the contact layers 24 and 25 of this example are made of μc-Si(n$^+$) having a resistivity of 10 Ωcm or less, they can be considered to be substantially the same as the source electrode 22 and the drain electrode 23. Accordingly, as described above, even when the gate electrode 21 does not overlap the source electrode 22 and the drain electrode 23, a series resistance connected with the ON resistance will not be produced in the portions of the contact layers 24 and 25 corresponding to the gaps between the source electrode 22 and the gate electrode 21 and between the drain electrode 23 and the gate electrode 21, respectively. As a result, the TFT 20d can provide an excellent response characteristic.

In FIGS. 10 and 11, the gate electrode 21 is formed at a position overlapping neither the source electrode 22 nor the drain electrode 23. The same effect can also be obtained when the gate electrode 21 is formed at a position overlapping the source electrode 22 and the drain electrode 23 as in Example 2. In this case, as in Example 2, the laser melt treatment can be easily conducted. More specifically, when a short-circuit or disconnection is found in the TFT 20d, the overlap portions of the gate electrode 21 with the source electrode 22 and the drain electrode 23 may be irradiated with a laser beam so as to short-circuit the source electrode 22 and the drain electrode 23 and thus to make a defect pixel less visible.

The same effect can also be obtained when the gate electrode 21 is formed so as to overlap either the source electrode 22 or the drain electrode 23 as in Example 3.

EXAMPLE 6

Figure 12:
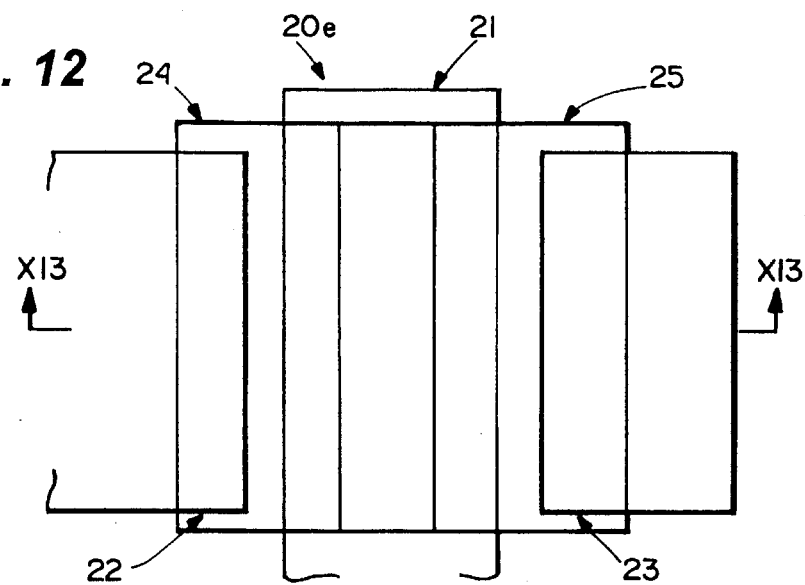
FIG. 12 is a plan view of a TFT of a sixth example according to the present invention.
Figure 13:
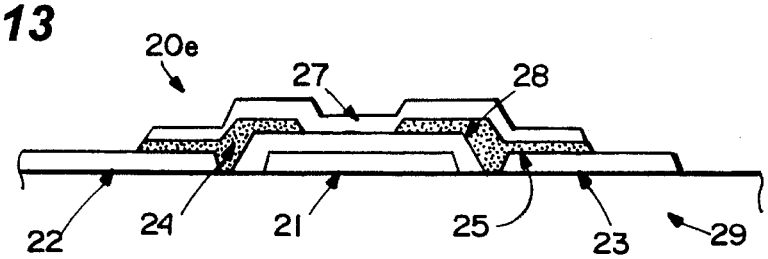
FIG. 13 is a sectional view of the TFT of the sixth example taken along line X13—X13 of FIG. 12.

FIGS. 12 is a plan view of a TFT 20e of the sixth example according to the present invention, and FIG. 13 is a sectional view of the TFT 20e taken along the line X13—X13 of FIG. 12. In this example, the same reference numerals denote the same or similar components to those in previous examples. The TFT 20e of this example is an inverted coplanar type transistor, and includes a gate electrode 21 formed on an insulating substrate 29. A gate insulating film 28 is formed to cover only the gate electrode 21, but not the entire surface of the insulating substrate 29. A source electrode 22 and a drain electrode 23 are then formed on portions of the insulating substrate 29 not covered with the gate insulating film 28.

Thereafter, ohmic contact layers 24 and 25 made of µc-Si(n$^+$) are formed separately from each other so as to overlap the source electrode 22 and the drain electrode 23, respectively, and also to overlap the gate electrode 21. A semiconductor layer 27 is formed over the portion of the gate insulating film 28 not covered with the contact layers 24 and 25 and over the contact layers 24 and 25.

Since the contact layers 24 and 25 of this example are made of µc-Si(n$^+$) having a resistivity of 10 Ωcm or less, they can be considered to be substantially the same as the source electrode 22 and the drain electrode 23 when the TFT 20e is activated. Accordingly, a series resistance connected with the ON resistance of the TFT 20e will not be produced even when the source electrode 22 and the drain electrode 23 do not overlap the gate electrode 21. As a result, the TFT 20e can provide an excellent response characteristic. This eliminates the necessity of forming overlap portions of the source electrode 22 and the drain electrode 23 with the gate electrode 21, and therefore the necessity of providing an overlap allowance in the photolithographic process for patterning the metal layer. Thus, the size of the TFT 20e can be reduced.

The same effect can also be obtained when the source electrode 22 and the drain electrode 23 are formed at positions overlapping the gate electrode 21 as in Example 2. In this case, as in Example 2, the laser melt treatment can be easily conducted for making a pixel defect less visible when a short-circuit or disconnection is found in the TFT 20e.

The same effect can also be obtained when either the source electrode 22 or the drain electrode 23 is formed at a position overlapping the gate electrode 21 as in Example 3.

EXAMPLE 7

Figure 14:
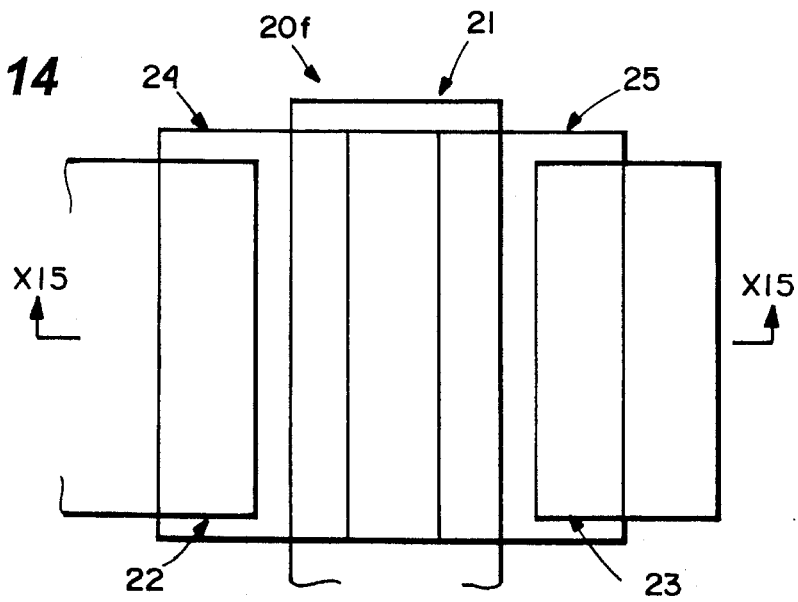
FIG. 14 is a plan view of a TFT of a seventh example according to the present invention.
Figure 15:
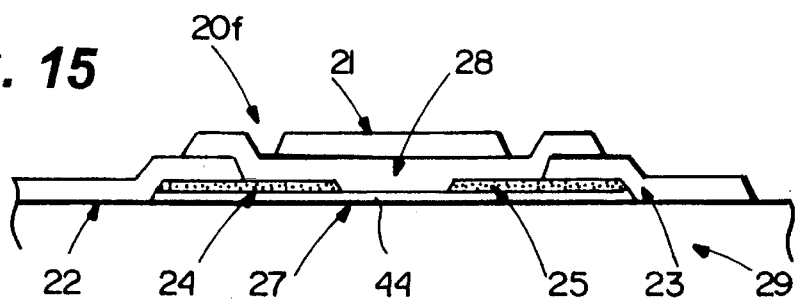
FIG. 15 is a sectional view of the TFT of the seventh example taken along line X15—X15 of FIG. 14.

FIG. 14 is a plan view of a TFT 20f of the seventh example according to the present invention, and FIG. 15 is a sectional view of the TFT 20f taken along the line X15—X15 of FIG. 14. In this example, the same reference numerals denote the same components as or similar components to those in previous examples. The TFT 20f of this example is a coplanar type transistor.

The method for fabricating the TFT 20f of this example will be described with reference to FIG. 15 as follows:

First, an a-Si(i) layer is formed on an insulating substrate 29 as a semiconductor layer 27, and then µc-Si(n$^+$) is deposited on the semiconductor layer 27. The deposited µc-Si(n$^+$) layer is then patterned to form ohmic contact layers 24 and 25 separate from each other. A source electrode 22 and a drain electrode 23 are then formed at positions overlapping the contact layers 24 and 25, respectively. Thereafter, a gate insulating film 28 is formed over part of the source electrode 22 and the drain electrode 23 and over the exposed portions of the contact layers 24 and 25 and the semiconductor layer 27. Finally, a gate electrode 21 made of a material having a small resistivity such as Al, Ti, and Ta is formed at a position overlapping the contact layers 24 and 25 but not overlapping the source electrode 22 and the drain electrode 23.

Since the contact layers 24 and 25 of this example are made of µc-Si(n$^+$) having a resistivity of 10 Ωcm or less as in the previous examples, the source electrode 22 and the drain electrode 23 need not overlap the gate electrode 21. This eliminates the necessity of providing an overlap allowance in the photolithographic process for patterning the metal layer, and thus the size of the TFT 20f can be reduced.

In FIGS. 14 and 15, the gate electrode 21 is formed at a position overlapping neither the source electrode 22 nor the drain electrode 23. The same effect can also be obtained when the gate electrode 21 is formed at a position overlapping the source electrode 22 and the drain electrode 23 as in Example 2. In this case, as in Example 2, the laser melt treatment can be easily conducted. More specifically, when a short-circuit or disconnection is found in the TFT 20f, the overlap portions of the gate electrode 21 with the source electrode 22 and the drain electrode 23 may be irradiated with a laser beam so as to short-circuit the source electrode 22 and the drain electrode 23 and thus make a defect pixel less visible.

The same effect can also be obtained when either the source electrode 22 or the drain electrode 23 is formed at a position overlapping the gate electrode 21 as in Example 3.

EXAMPLE 8

Figure 16:
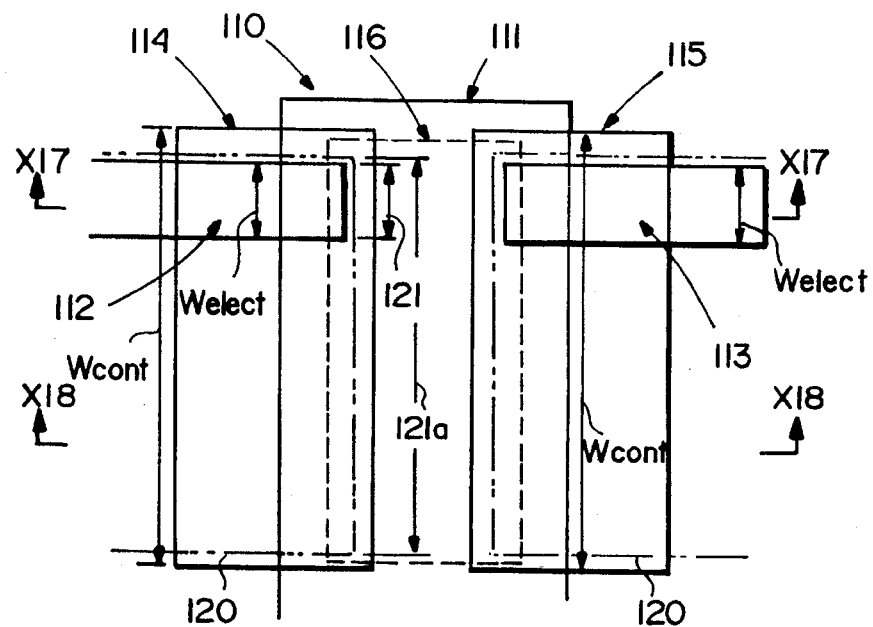
FIG. 16 is a plan view of a TFT of an eighth example according to the present invention.
Figure 17:
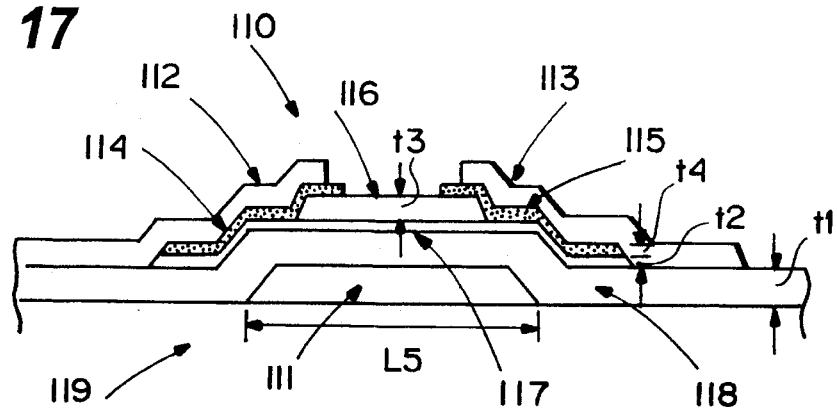
FIG. 17 is a sectional view of the TFT of the eighth example taken along line X17—X17 of FIG. 16.
Figure 18:
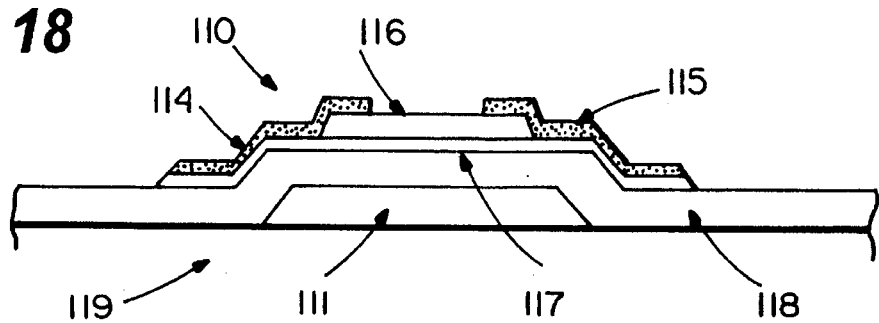
FIG. 18 is a sectional view of the TFT of the eighth example taken along line X18—X18 of FIG. 16.

FIG. 16 is a plan view of a TFT 110 of the eighth example according to the present invention, and FIGS. 17 and 18 are sectional views of the TFT 110 taken along the lines X17—X17 and X18—X18 in FIG. 16. The TFT 110 is an inverted staggered type transistor having an etching stopper layer 116. As shown in FIGS. 16 to 18, the TFT 110 of this example includes a gate electrode 111, a gate insulating film 118, a semiconductor layer 117, an etching stopper layer 116, ohmic contact layers 114 and 115, and source and drain electrodes 112 and 113. All of these layers are formed in this order on an insulating substrate 119.

The method for fabricating the TFT 110 of this example will be described with reference to FIGS. 16 to 18 as follows:

First, material such as Al, Ti, and Ta having a small resistivity is deposited on the insulating substrate 119 so as to form a conductive film. The film is then patterned to form the gate electrode 111 having a width L5 in the channel length direction. In this example, Ta was deposited on the insulating substrate 119 made of glass to a thickness of 300 nm by sputtering. The width L5 of the gate electrode 111 was 15 µm. On the thus-formed gate electrode 111 are formed the gate insulating film 118, the semiconductor layer 117, and the etching stopper layer 116 in this order to thicknesses of t1, t2, and t3, respectively. In this example, SiN$_x$ was first deposited to a thickness of approximately 300 nm covering the gate electrode 111, so as to form the gate insulating film 118. Thereafter, intrinsic amorphous silicon (a-Si(i)) was deposited to a thickness of approximately 30 nm to form the semiconductor layer 117, and then SiN$_x$ was again deposited to a thickness of approximately 200 nm. Plasma CVD was used for the above series of deposition. The latter SiN$_x$ layer was then patterned to form the etching stopper layer 116.

Then, phosphorus-doped n$^+$-type microcrystalline silicon (μc-Si(n$^+$)) is deposited to a thickness t4, for example, in an atmosphere of monosilane, phosphine, and hydrogen at a flow ratio of 1:1:100 with power higher than that conventionally used. In this example, the deposition of μc-Si(n$^+$) was conducted under the conditions of the substrate temperature of 260° C., the power density of 0.05 W/cm$^2$, and the pressure of 110 Pa, so as to form the μc-Si(n$^+$) layer having a thickness of 50 nm.

The thus formed a-Si(i) layer and μc-Si(n$^+$) layer are patterned together to form the semiconductor layer 117 and the contact layers 114 and 115, respectively. The existence of the contact layers 114 and 115 made of μc-Si(n$^+$) provides a favorable ohmic contact of the semiconductor layer 117 made of a-Si(i) layer with the source electrode 112 and the drain electrode 113. Further, the contact layers 114 and 115 made of μc-Si(n$^+$) have a conductivity of a hundred to a thousand times higher than contact layers made of a-Si(n$^+$) used for the conventional TFTs. For example, the resistivity of a-Si(n$^+$) is in the order of 1000 Ωcm, while μc-Si(n$^+$) is less than 10 Ωcm. This indicates that the contact layers 114 and 115 of this example can be considered as metal electrodes when the TFT 110 is activated.

Thereafter, metal such as Ti, Al, Cr, and Mo is deposited over the entire top surface of the substrate. The deposited metal layer is then patterned to form the source electrode 112 and the drain electrode 113. The source electrode 112 and the drain electrode 113 are formed in the following manner. The source electrode 112 and the drain electrode 113 overlap the gate electrode 111 and at least one end face of each of the source electrode 112 and the drain electrode 113 is located inside of the corresponding end face of each of the contact layers 114 and 115 by 3 μm or more. In this example, Ti was deposited to a thickness of 300 nm by sputtering, and the deposited Ti was patterned so that the lower end face of each of the source electrode 112 and the drain electrode 113 (as viewed in FIG. 16) should be located inside the lower end face of each of the corresponding contact layers 114 and 115 by 40 μm. Thus, the fabrication of the TFT 110 is completed.

According to this example, the region 121 where the source electrode 112 and the drain electrode 113 face each other via a channel region of the TFT 110 is smaller than the region 121a where conventional source and drain electrodes shown by two-dot dash lines in FIG. 16 face each other via the channel region. In general, high-precision patterning for the source electrode and the drain electrode with a small gap interposed therebetween is difficult. However, in this example, the size reduction of the region where the source and drain electrodes face each other makes it easier to conduct the photolithographic process of the TFT 110.

As described above, the contact layers 114 and 115 act as parts of the source electrode 112 and the drain electrode 113, respectively. Therefore, the effective channel width W$_{rms}$ of the TFT 110 is independent of the width W$_{elect}$ of the source electrode 112 and the drain electrode 113, and substantially identical to the width W$_{cont}$ of the contact layers 114 and 115. It is therefore possible to design small patterns for the source electrode 112 and the drain electrode 113. As a result, the size of the TFT 110 can be reduced.

EXAMPLE 9

Figure 19:
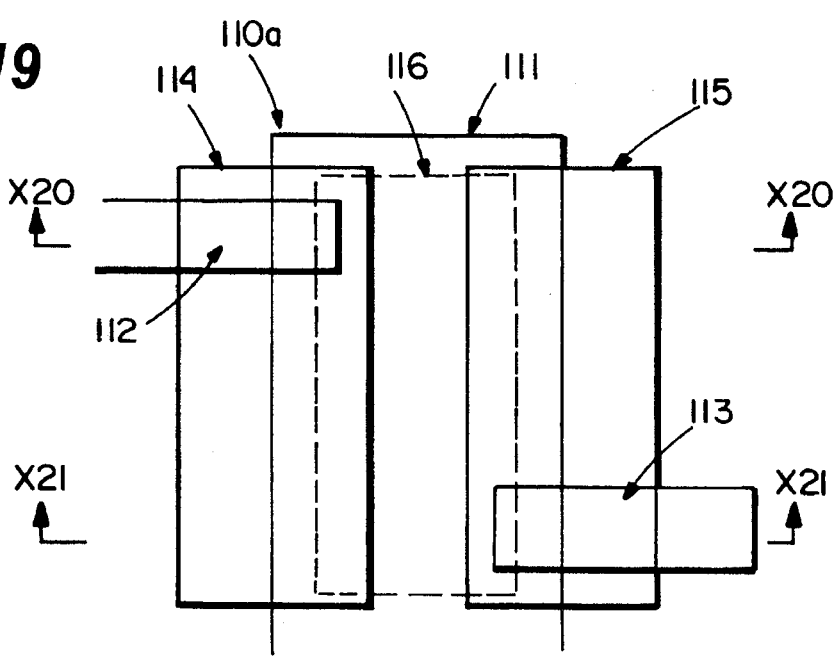
FIG. 19 is a plan view of a TFT of a ninth example according to the present invention.
Figure 20:
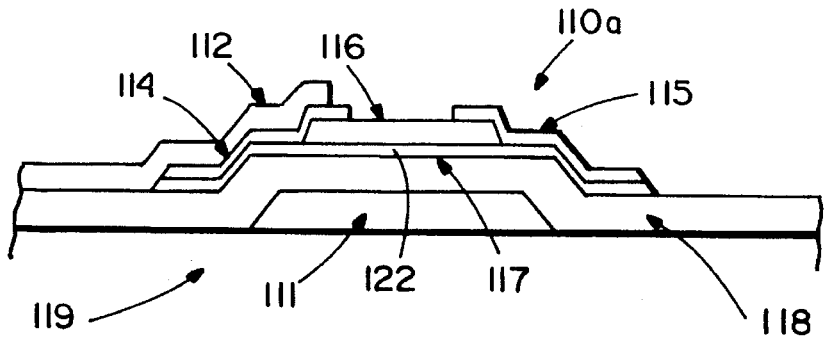
FIG. 20 is a sectional view of the TFT of the ninth example taken along line X20—X20 of FIG. 19.
Figure 21:
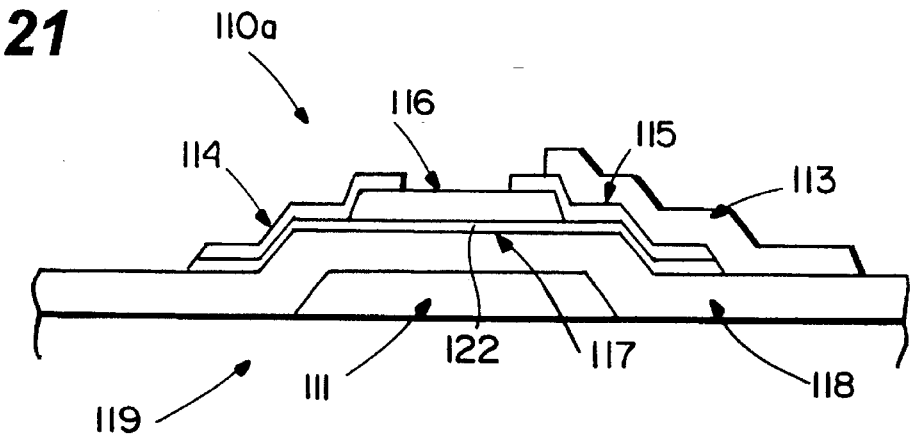
FIG. 21 is a sectional view of the TFT of the ninth example taken along line X21—X21 of FIG. 19.

FIG. 19 is a plan view of a TFT 110a of the ninth example according to the present invention. FIGS. 20 and 21 are sectional views of the TFT 110a taken along the lines X20—X20 and X21—X21 of FIG. 19. This example resembles Example 8, and the same reference numerals denote the same or similar components to those in Example 8.

A source electrode 112 and a drain electrode 113 of the TFT 110a are narrow in width compared with the contact layers 114 and 115 in Example 8. The positions of such narrow source electrode 112 and drain electrode 113 can be freely determined insofar as they are within the patterns of the contact layers 114 and 115. In the TFT 110a as shown in FIG. 9, the source electrode 112 and the drain electrode 113 are formed at positions displaced from each other via a channel region of the TFT 110a in the channel width direction so that they will not face each other. Further, the lower end face of the source electrode 112 and the upper end face of the drain electrode 113 are located inside of the corresponding end face of the contact layers 114 and 115 by 3 μm or more. According to this structure, the advantages described in Example 8 can also be obtained. This example is further advantageous in that the high-precision patterning for the source electrode and the drain electrode can be more easily conducted than in Example 8 because of the increase of the distance between the source electrode and the drain electrode.

EXAMPLE 10

Figure 22:
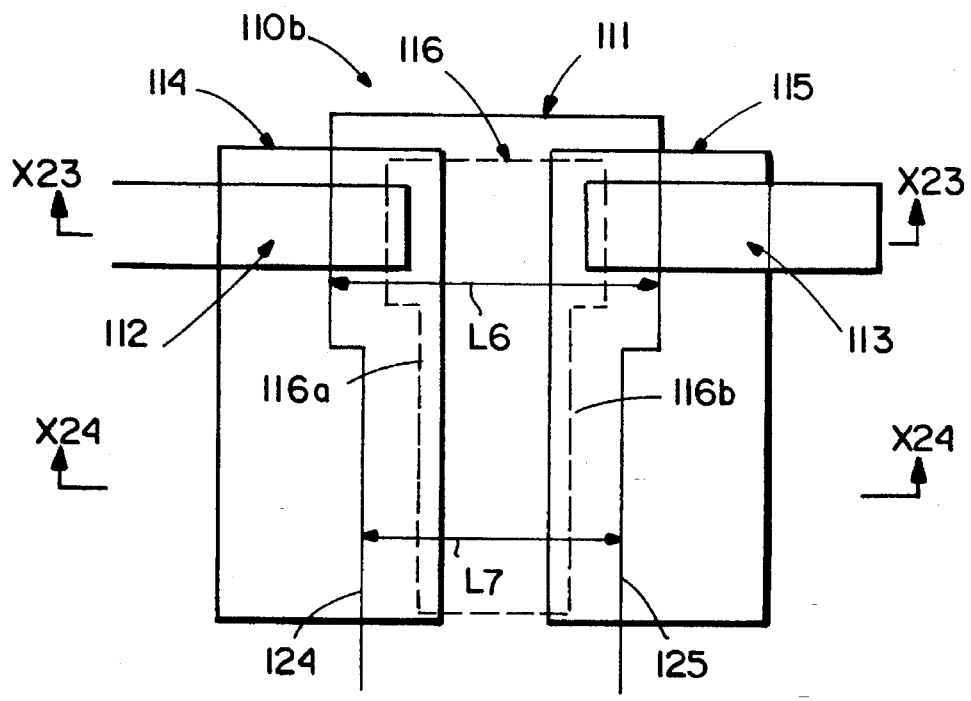
FIG. 22 is a plan view of a TFT of a tenth example according to the present invention.
Figure 23:
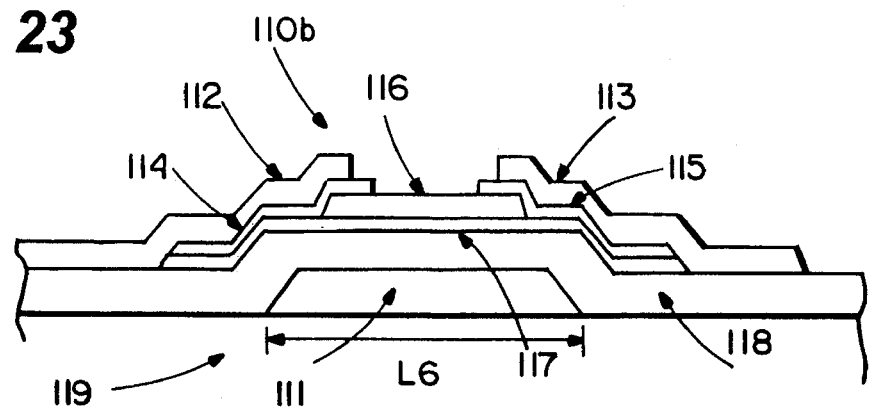
FIG. 23 is a sectional view of the TFT of the tenth example taken along line X23—X23 of FIG. 22.
Figure 24:
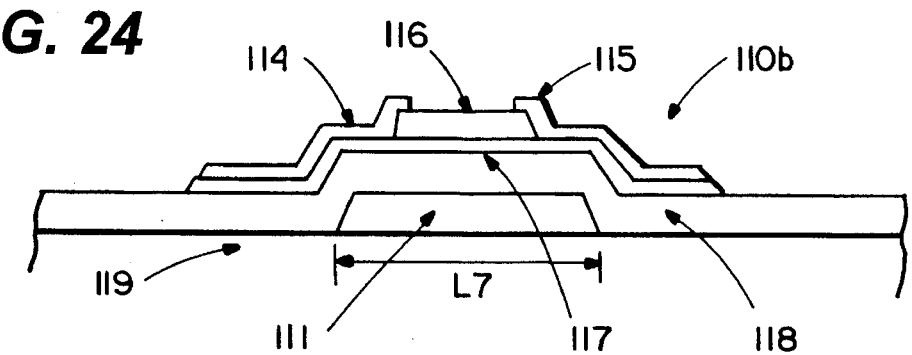
FIG. 24 is a sectional view of the TFT of the tenth example taken along line X24—X24 of FIG. 22.

FIG. 22 is a plan view of a TFT 110b of the tenth example according to the present invention, and FIGS. 23 and 24 are sectional views of the TFT 110b taken along the lines X23—X23 and X24—X24 of FIG. 22. This example resembles Example 8, and the same reference numerals denote the same components as or similar components to those in Example 8. In this example, the source electrode 112 and the drain electrode 113 are formed at positions overlapping the gate electrode 111 so that the lower end face of each of the source electrode 112 and the drain electrode 113 should be located inside of the lower end face of each of the corresponding contact layers 114 and 115 by 3 μm or more. The TFT 110b of this example is different from that of Example 8 in that the gate electrode 111 has a first portion with a width L6 and a second portion with a width L7. Recesses 124 and 125 are formed on both sides of the second portion of the gate electrode 111 where no overlap portions of a source electrode 112 and a drain electrode 113 with the gate electrode 111 are formed, so that the width L7 of the second portion is smaller than the width L6 of the first portion. This structure is effective in reducing the parasitic capacitance that is generated in overlaps of the source electrode 112 and the drain electrode 113 with the gate electrode 111, because the size of the overlaps can be made smaller. Thus, the performance of the resultant TFT 110b can be improved.

An etching stopper layer 116 also has recesses 116a and 116b corresponding to the recesses 124 and 125 of the gate electrode 111 so that the etching layer 116 includes two portions which have two different widths in the channel length direction. In this example, the width of the first and second portions of the gate electrode 111 were 15 μm and 9 μm, and the widths of the etching stopper layer 116 were 11 μm and 5 μm, respectively.

The resultant TFT 110b of this example can provide the same effects as those described in Examples 8 and 9.

EXAMPLE 11

Figure 25:
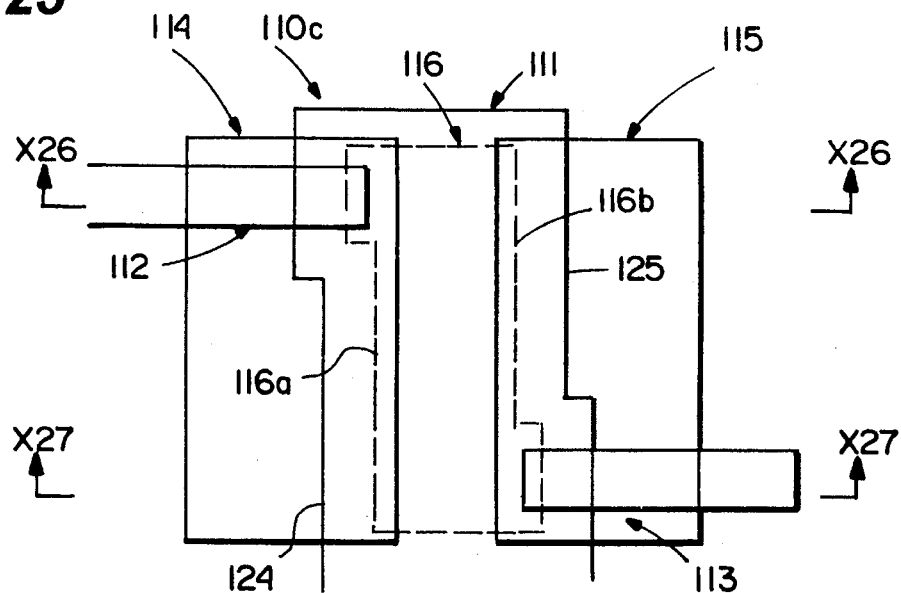
FIG. 25 is a plan view of a TFT of an eleventh example according to the present invention.
Figure 26:
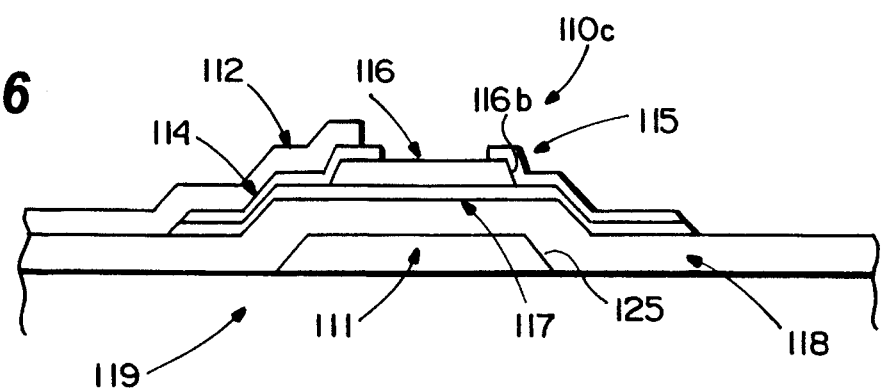
FIG. 26 is a sectional view of the TFT of the eleventh example taken along line X26—X26 of FIG. 25.
Figure 27:
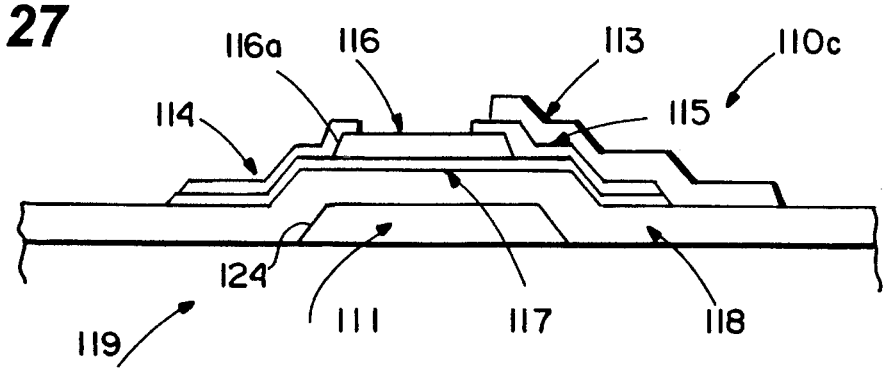
FIG. 27 is a sectional view of the TFT of the eleventh example taken along line X27—X27 of FIG. 25.

FIG. 25 is a plan view of a TFT 110c of the eleventh example according to the present invention, and FIGS. 26 and 27 are sectional views of the TFT 110c taken along the lines X26—X26 and X27—X27 of FIG. 25. This example resembles Examples 9 and 10, and the same reference numerals denote the same or similar components to those in Examples 9 and 10.

The TFT 110c of this example is a combination of Examples 9 and 10. The source electrode 112 and the drain electrode 113 are formed at positions displaced from each other in the channel width direction so that they will not face each other as in Example 9. The lower end face of the source electrode 112 is located inside of the lower end face of the contact layer 114 by 3 µm or more, and the upper end face of the drain electrode 113 is located inside of the upper end face of the contact layer 115 by 3 µm or more. Recesses 124 and 125 are formed on both sides of the portions of the gate electrode 111 as shown in FIG. 22. The portion of the gate electrode 111 where the source electrode 112 or the drain electrode 113 overlaps the gate electrode 111 is wider than the remaining portion thereof in the channel length direction. In this example, the width of the portions where the source electrode 112 and the drain electrode 113 overlap the gate electrode 111 is 12 µm and the width of the remaining portion 9 µm. The portion where the source electrode 112 is provided may have a different width from that of the portion where the drain electrode 113 is provided. An etching stopper layer 116 also has recesses 116a and 116b corresponding to the recesses 124 and 125 of the gate electrode 111.

The resultant TFT 110c of this example can provide the same effects as those described in Examples 8 to 10.

As described above, in Examples 8 to 11, the source electrode 112 and the drain electrode 113 overlap the gate electrode 111 as in Example 2. Therefore, when a defect is found in any of the TFTs 110 to 110c, the source electrode 112 or the drain electrode 113 and the gate electrode 111 can be easily short-circuited by the laser melt treatment. This makes a pixel defect due to the defect in the TFT less visible, so that the reliability and the usability can be improved.

EXAMPLE 12

Figure 28:
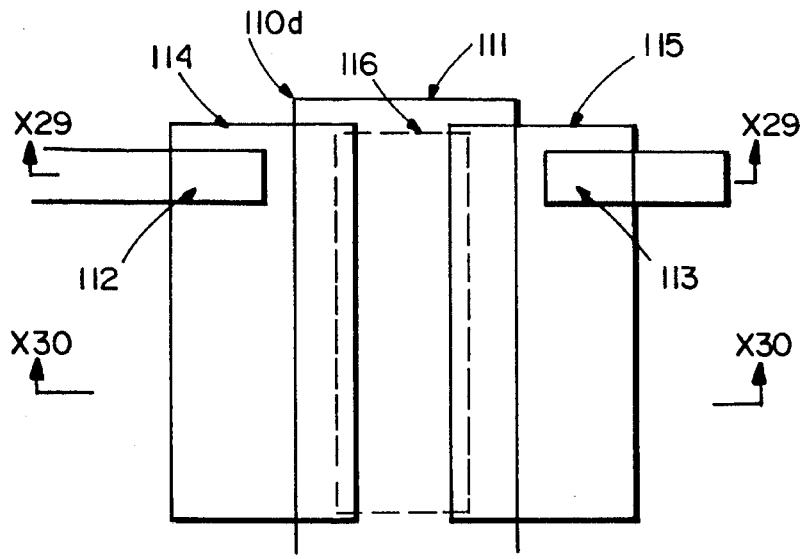
FIG. 28 is a plan view of a TFT of a twelfth example according to the present invention.
Figure 29:
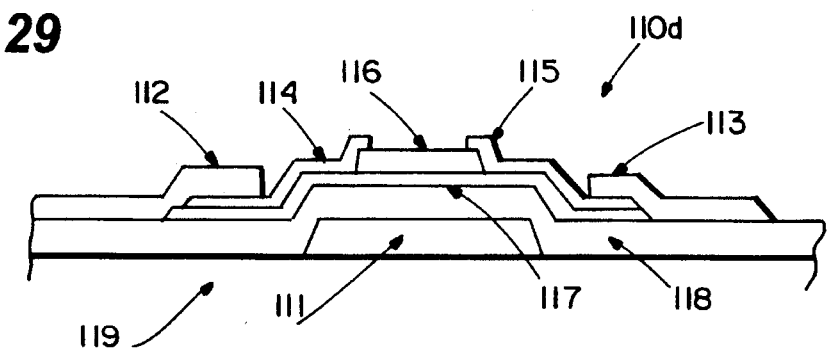
FIG. 29 is a sectional view of the TFT of the twelfth example taken along line X29—X29 of FIG. 28.
Figure 30:
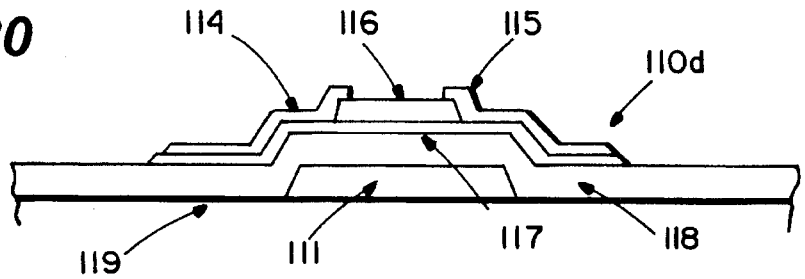
FIG. 30 is a sectional view of the TFT of the twelfth example taken along line X30—X30 of FIG. 28.

FIG. 28 is a plan view of a TFT 110d of the twelfth example according to the present invention, and FIGS. 29 and 30 are sectional views of the TFT 110d taken along the lines X29—X29 and X30—X30 of FIG. 28. This example resembles Example 8, and the same reference numerals denote the same components as or similar components to those in Example 8. The TFT 110d of this example is a combination of Examples 1 and 8. That is, the source electrode 112 and the drain electrode 113 are formed at positions not overlapping the gate electrode 111.

As is described in Example 1, the contact layers 114 and 115 which are made of µc-Si(n⁺) having a high resistivity act as part of the source electrode 112 and the drain electrode 113 when the TFT 110d is activated. This eliminates the necessity of forming the source electrode 112 and the drain electrode 113 so as to overlap the gate electrode 111. Accordingly, with this structure, a parasitic capacitance can be reduced because no overlap portions of the source electrode 112 and the drain electrode 113 are formed over the gate electrode 111.

In addition, at least one of the source electrode 112 and the drain electrode 113 may be formed so as to overlap the gate electrode 111. In this case, it is easier to conduct the laser melt treatment when a defect is found in the TFT 110d.

EXAMPLE 13

Figure 31:
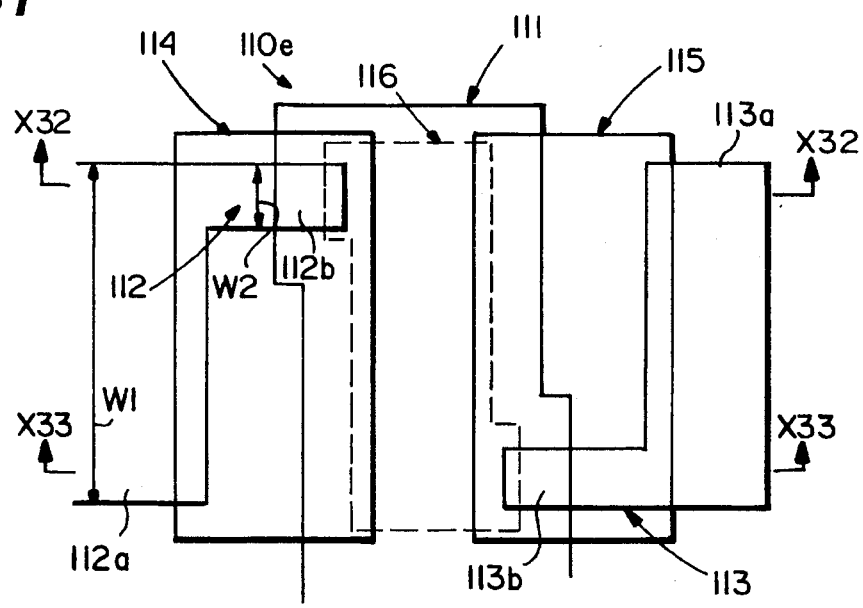
FIG. 31 is a plan view of a TFT of a thirteenth example according to the present invention.
Figure 32:
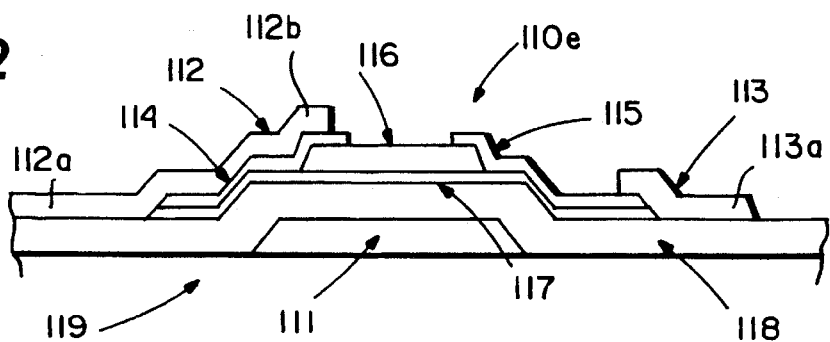
FIG. 32 is a sectional view of the TFT of the thirteenth example taken along line X32—X32 of FIG. 31.
Figure 33:
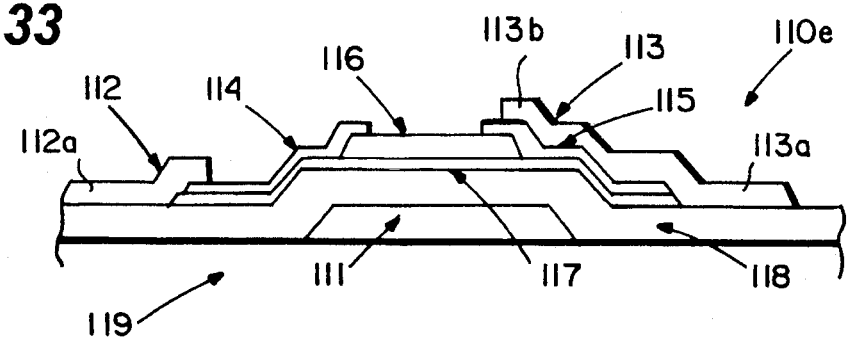
FIG. 33 is a sectional view of the TFT of the thirteenth example taken along line X33—X33 of FIG. 31.

FIG. 31 is a plan view of a TFT 110e of the thirteenth example according to the present invention, and FIGS. 32 and 33 are sectional views of the TFT 110e taken along the lines X32—X32 and X33—X33 of FIG. 31. This example resembles Examples 8 to 11, and the same reference numerals denote the same or similar components to those in Examples 8 to 11.

In the TFT 110e of this example, a source electrode 112 has a wide portion 112a having a width W1 in the channel width direction and a narrow portion 112b having a width W2 smaller than the width W1. A part of the narrow portion 112b is located on the contact layer 114. The lower end face of the narrow portion 112b is located inside of the lower end face of the contact layer 114 by 3 µm or more. Likewise, the drain electrode 113 has a wide portion 113a having the width W1 and a narrow portion 113b having the width W2 smaller than the width W1. A part of the narrow portion 113b is located on a contact layer 115. The upper end face of the narrow portion 113b is located inside of the upper end face of the contact layer 115 by 3 µm or more.

With the above structure, the same effects as those described in the previous examples can be obtained. Additionally, in this example, the source electrode 112 and the drain electrode 113 are prevented from being discontinued due to the steps produced by the ends of a semiconductor layer 117 and the contact layers 114 and 115.

EXAMPLE 14

Figure 34:
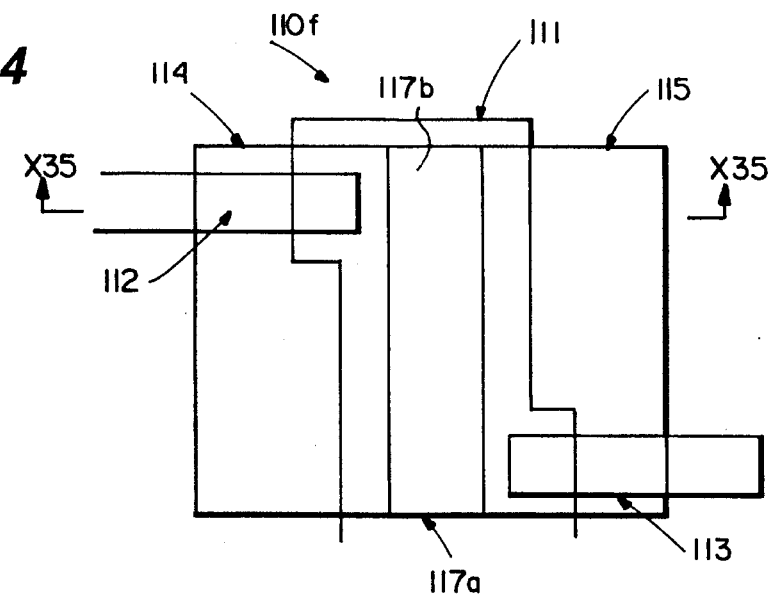
FIG. 34 is a plan view of a TFT of a fourteenth example according to the present invention.
Figure 35:
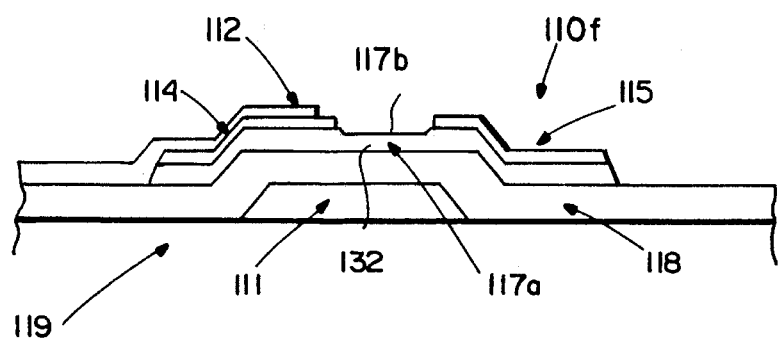
FIG. 35 is a sectional view of the TFT of the fourteenth example taken along line X35—X35 of FIG. 34.

FIG. 34 is a plan view of a TFT 110f of the fourteenth example according to the present invention, and FIG. 35 is a sectional view of the TFT 110f taken along the line X35—X35 of FIG. 34. This example resembles Example 11, and the same reference numerals denote the same or similar components to those in Examples 11.

The TFT 110f of this example does not include an etching stopper layer unlike the TFT 110c of Example 11. Instead, the thickness of a semiconductor layer 117a is made thicker than that of the semiconductor layer 117 of the previous examples. More precisely, without an etching stopper layer, the semiconductor layer 117a is etched at the patterning for forming contact layers 114 and 115, forming a recess 117b. Therefore, the semiconductor layer 117a is made sufficiently thick so that a channel region 132 with a predetermined size required for the TFT 110f can be formed. In this example, the thickness of the semiconductor layer 117a was set to be 100 nm.

The resultant TFT 110f of this example can provide the same effects as those described in Examples 8 to 13.

EXAMPLE 15

Figure 36:
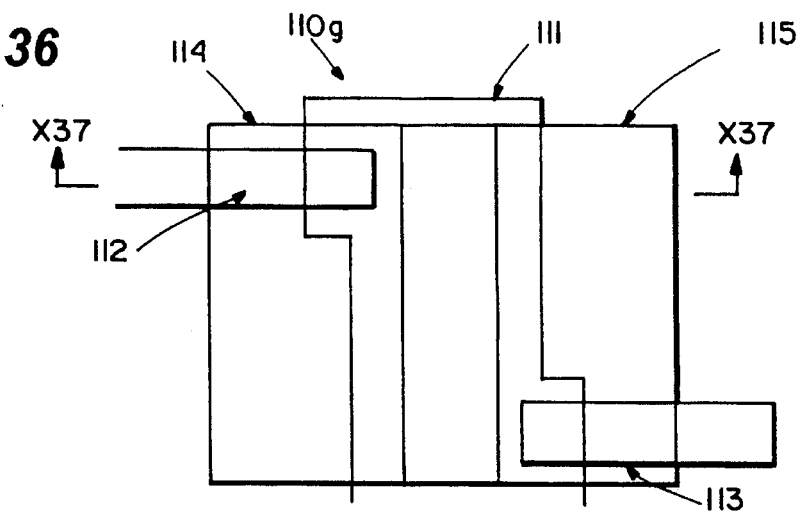
FIG. 36 is a plan view of a TFT of a fifteenth example according to the present invention.
Figure 37:
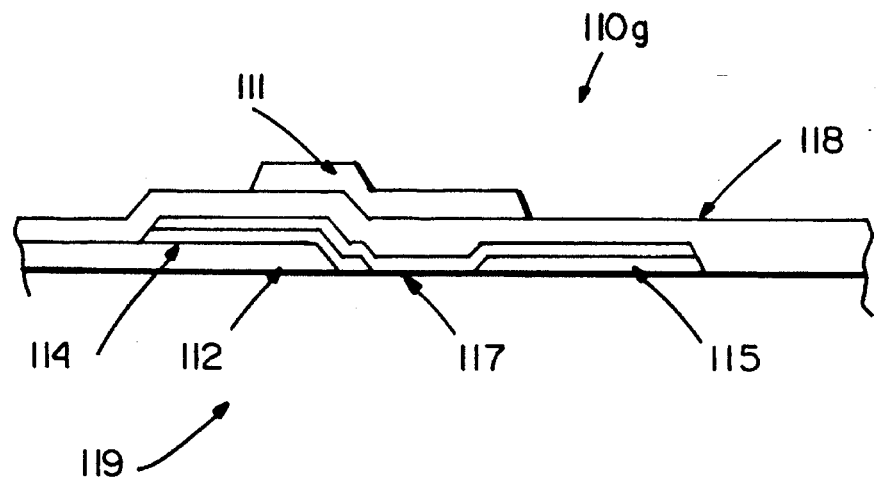
FIG. 37 is a sectional view of the TFT of the fifteenth example taken along line X37—X37 of FIG. 36.

FIG. 36 is a plan view of a TFT 110g of the fifteenth example according to the present invention, and FIG. 37 is a sectional view of the TFT 110g taken along the line X37—X37 of FIG. 36. This example resembles Examples 8 to 14, and the same reference numerals denote the same or similar components to those in Examples 8 to 14.

The TFT 110g of this example is a staggered type transistor, and includes source and drain electrodes 112 and 113, ohmic contact layers 114 and 115 formed as described earlier, a semiconductor layer 117, a gate insulating film 118, and a gate electrode 111. These layers are formed in this order on an insulating substrate 119. As in Example 11, the source electrode 112 and the drain electrode 113 are located so as to be displaced from each other in the channel width direction, and the portions of the gate electrode 111 where the source electrode 112 or the drain electrode 113 overlaps the gate electrode 111 is wider than the remaining portion thereof. The lower end face of the source electrode 112 and the upper end face of the drain electrode 113 are located inside the corresponding end face of the contact layers 114 and 115 by 3 μm or more.

The resultant TFT 110g of this example can provide the same effects as those described in Examples 8 to 14, though it is a staggered type transistor unlike the TFTs in Examples 8 to 14.

EXAMPLE 16

Figure 38:
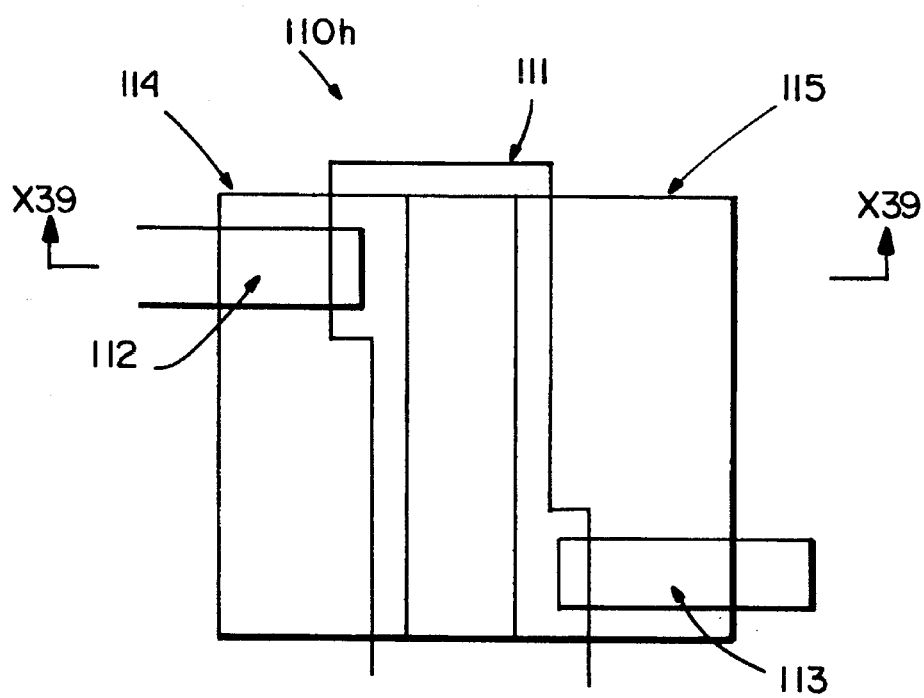
FIG. 38 is a plan view of a TFT of a sixteenth example according to the present invention.
Figure 39:
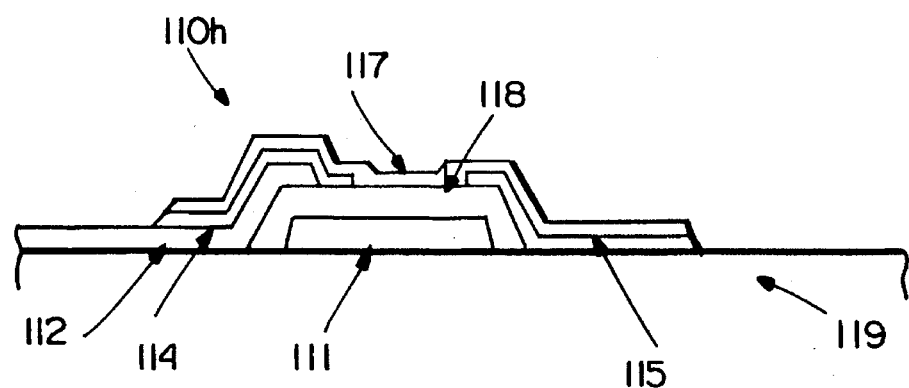
FIG. 39 is a sectional view of the TFT of the sixteenth example taken along line X39—X39 of FIG. 38.

FIG. 38 is a plan view of a TFT 110h of the sixteenth example according to the present invention, and FIG. 39 is a sectional view of the TFT 110h taken along the line X39—X39 of FIG. 38. This example resembles Examples 8 to 15, and the same reference numerals denote the same or similar components to those in Examples 8 to 15. The difference between the TFT 110h of this example and the TFTs of Examples 8 to 15 will be described below.

The TFT 110h of this example is an inverted coplanar type transistor, and includes a gate electrode 111 formed on an insulating substrate 119. A gate insulating film 118 is formed to cover only the gate electrode 111, but not the entire surface of the insulating substrate 119. A source electrode 112 and a drain electrode 113 are then formed on the portions of the insulating substrate 119 not covered with the gate insulating film 118.

The resultant TFT 110h of this example can provide the same effects as those described in Examples 8 to 15, though it is an inverted coplanar type transistor unlike the TFTs in Examples 8 to 15.

EXAMPLE 17

Figure 40:
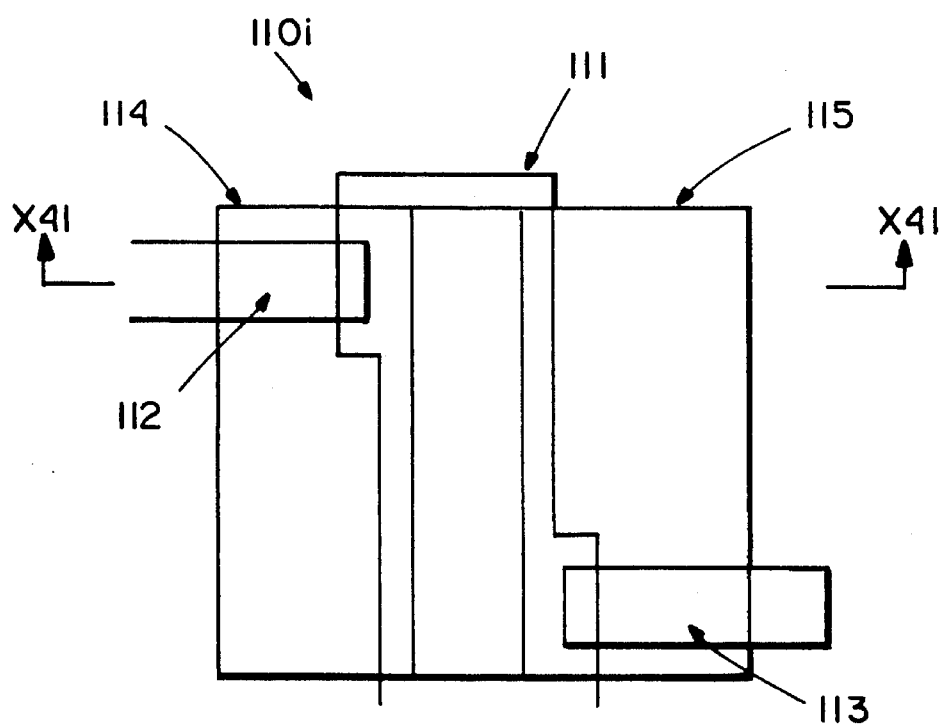
FIG. 40 is a plan view of a TFT of a seventeenth example according to the present invention.
Figure 41:
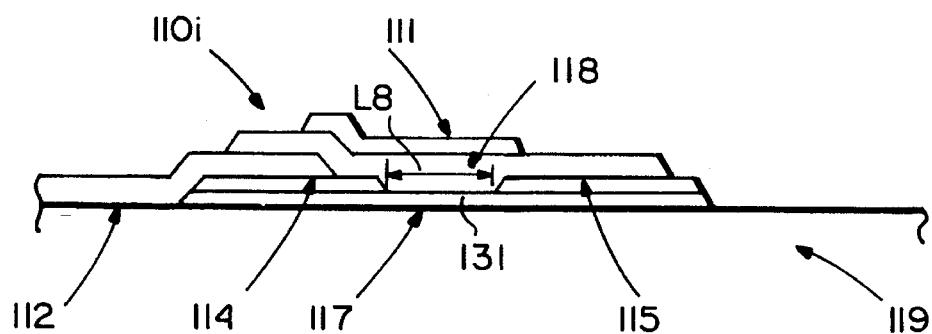
FIG. 41 is a sectional view of the TFT of the seventeenth example taken along line X41—X41 of FIG. 40.

FIG. 40 is a plan view of a TFT 110i of the seventeenth example according to the present invention, and FIG. 41 is a sectional view of the TFT 110i taken along the line X41—X41 of FIG. 40. This example resembles Examples 8 to 16, and the same reference numerals denote the same or similar components to those in Examples 8 to 16. The difference between the TFT 110i and the TFTs of Example 8 to 16 will be described below.

The TFT 110i of this example is a coplanar type transistor, and includes a semiconductor layer 117 formed on an insulating substrate 119. Ohmic contact layers 114 and 115 are then formed on the semiconductor layer 117 apart from each other by a distance L8 to form a channel region 131 therebetween. In this example, the distance L8 was set to be 4 μm. A source electrode 112 and a drain electrode 113 are then formed at positions overlapping the contact layers 114 and 115, respectively. Thereafter, a gate insulating film 118 is formed over part of the source electrode 112 and the drain electrode 113 and over the exposed portions of the contact layers 114 and 115 and the semiconductor layer 117. Finally, a gate electrode 111 is formed on the gate insulating film 118 at a position overlapping the contact layers 114 and 115, the source electrode 112 and the drain electrode 113.

The resultant TFT 110i of this example can provide the same effects as those described in Examples 8 to 16.

For the evaluation of the characteristics of the TFTs 110a to 110i in Examples 8 to 17, the case where the contact layers 114 and 115 of each of the TFTs 110a to 110i are formed of a-Si(n$^+$) as in conventional TFTs, not μc-Si(n$^+$), will be described. In such a case, the width $W_{elect}$ of the source electrode 112 and the drain electrode 113 can be smaller than the width $W_{cont}$ of the contact layers 114 and 115 by 1–3 μm for each side without reducing the flow of a drain current. This is because, even when the contact layers 114 and 115 are made of a-Si(n$^+$), the current flow from/to the source electrode 112 and the drain electrode 113 spreads beyond the width of the source electrode 112 and the drain electrode 113 over the contact layers 114 and 115 by approximately 1–3 μm.

Figure 42:
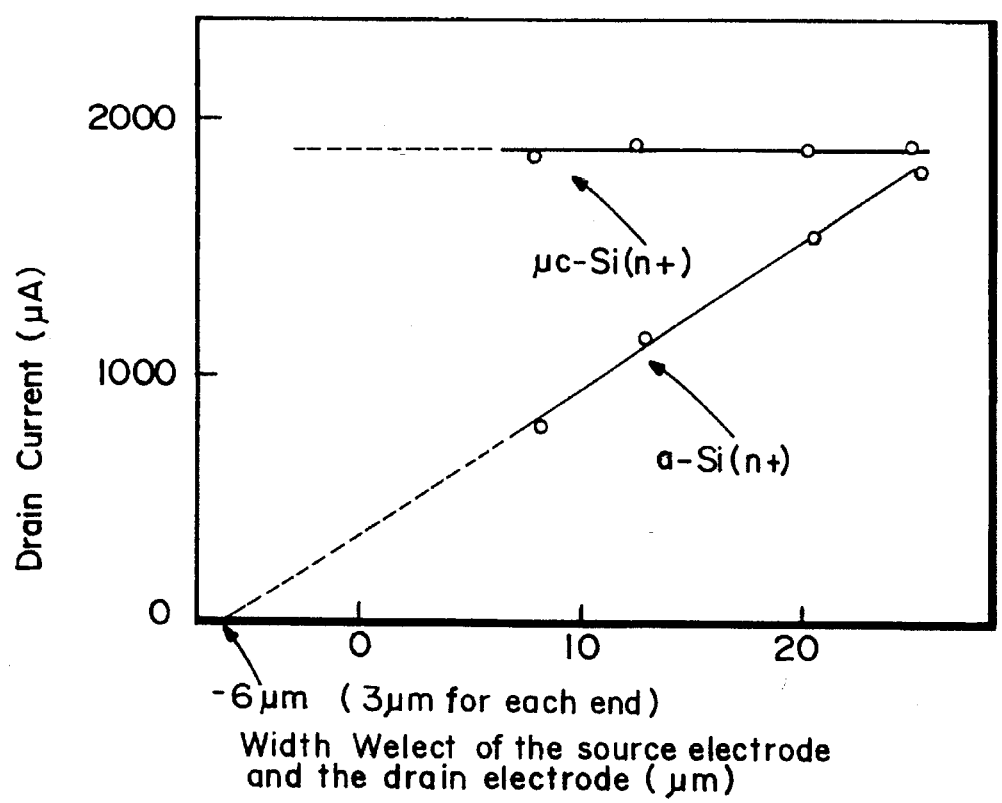
FIG. 42 is a graph showing the drain current as a function of the width of the source electrode and the drain electrode.
Figure 43:
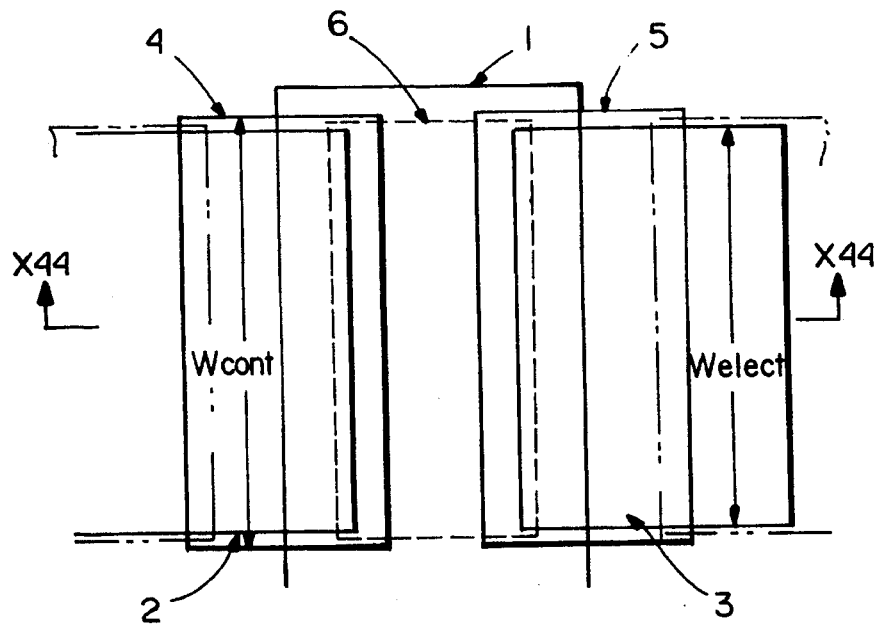
FIG. 43 is a plan view of the first conventional TFT of an inverted staggered type.
Figure 44:
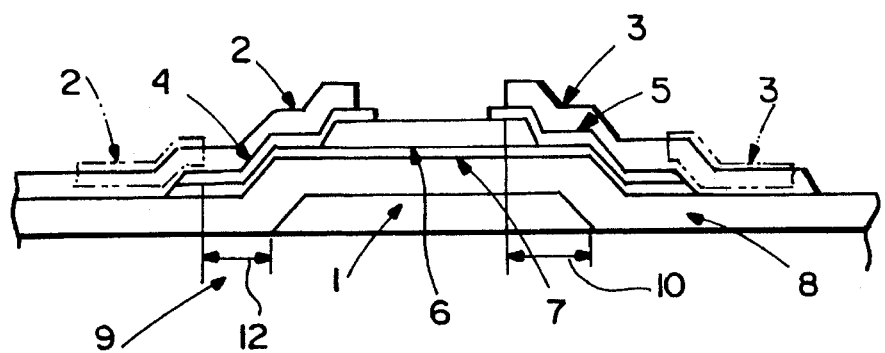
FIG. 44 is a sectional view of the first conventional TFT taken along line X44—X44 of FIG. 43.
Figure 45:
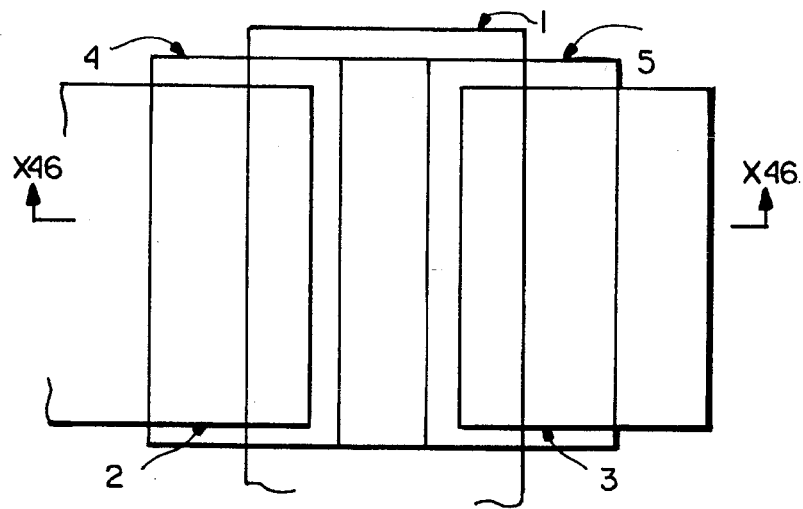
FIG. 45 is a plan view of the second conventional TFT of the inverted staggered type.
Figure 46:
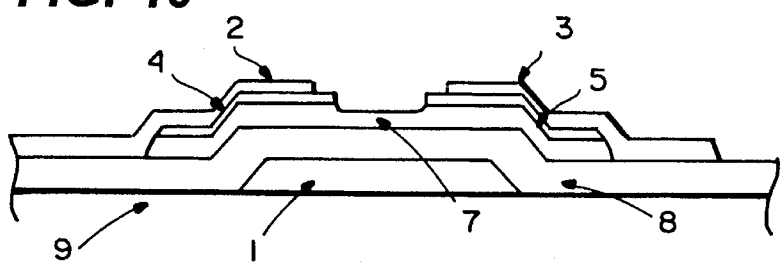
FIG. 46 is a sectional view of the second conventional TFT taken along line X46—X46 of FIG. 45.
Figure 47:
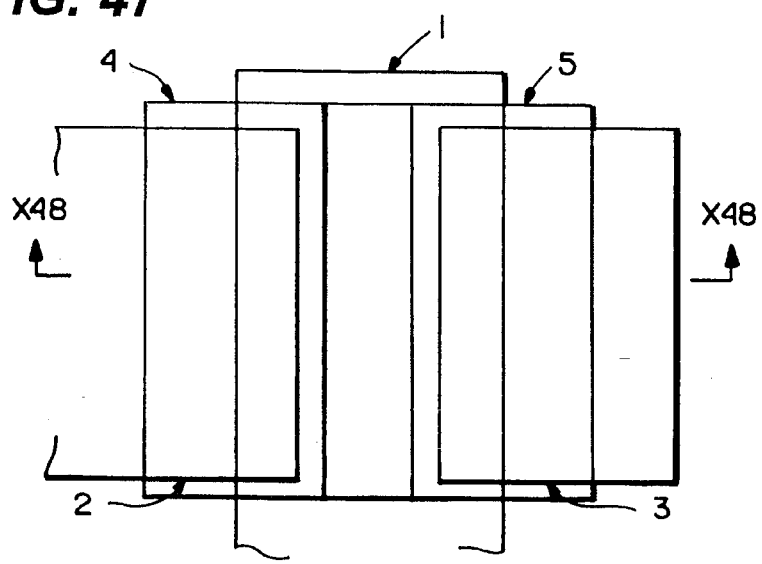
FIG. 47 is a plan view of a third conventional TFT of a staggered type.
Figure 48:
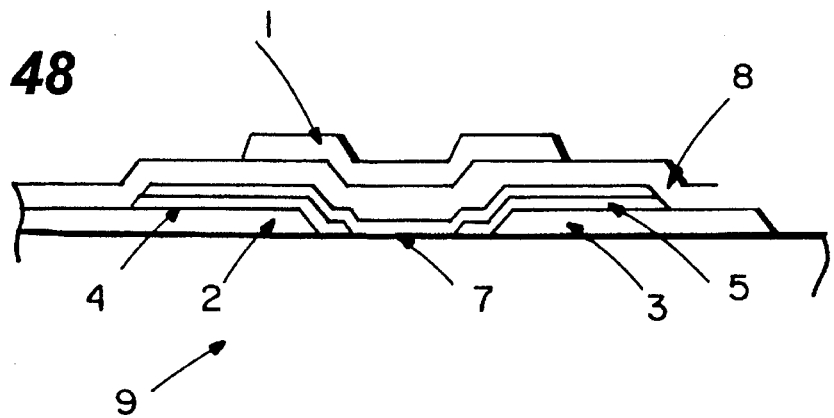
FIG. 48 is a sectional view of the third conventional TFT taken along line X48—X48 of FIG. 47.
Figure 49:
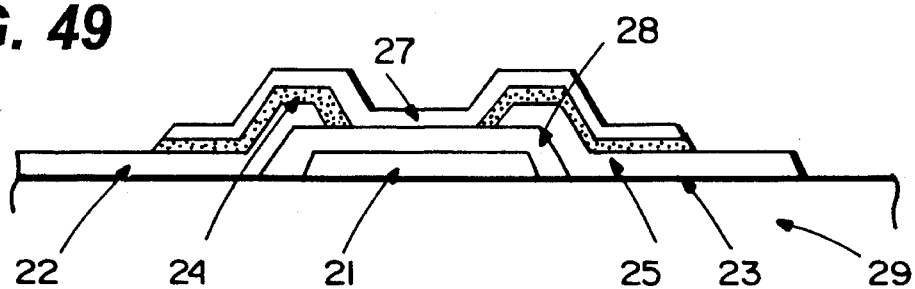
FIG. 49 is a sectional view of the fourth conventional TFT of an inverted coplanar type.
Figure 50:
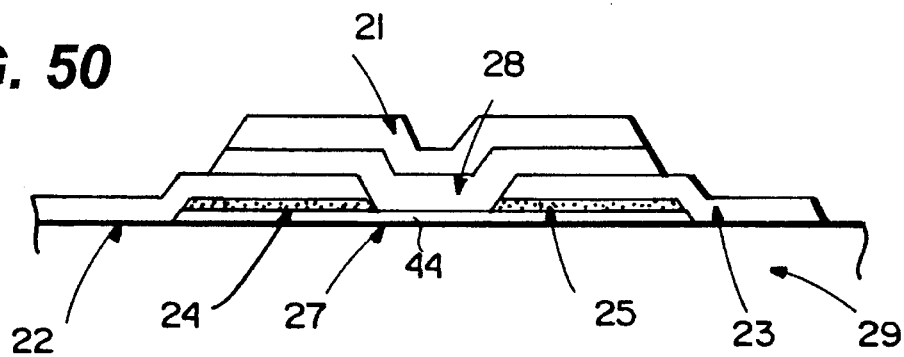
FIG. 50 is a sectional view of the fifth conventional TFT of a coplanar type.

FIG. 42 shows the drain current flow as the function of the width $W_{elect}$ of the source electrode 112 and the drain electrode 113 when the width $W_{cont}$ of the contact layers 114 and 115 is 28 μm. As shown in FIG. 42, according to the conventional example, as the width $W_{elect}$ of the source electrode 112 and the drain electrode 113 is smaller, the effective channel width $W_{rms}$ becomes smaller, resulting in reducing the ON current.

On the other hand, according to the present invention, since μc-Si(n$^+$) is used for the contact layers 114 and 115, the contact layers 114 and 115 act as the source electrode 112 and the drain electrode 113. Therefore, if the width $W_{elect}$ of each of the source electrode 112 and the drain electrode 113 is made smaller than the width $W_{cont}$ of each contact layer by 3 μm or more, the drain current is not reduced as shown in FIG. 42, because the effective channel width $W_{rms}$ of the TFT is independent of the width $W_{elect}$ of the source electrode 112 and the drain electrode 113, and identical to the width $W_{cont}$ of the contact layers 114 and 115.

As a result, the width $W_{elect}$ of the source electrode 112 and the drain electrode 113 can be reduced, and thus a smaller-size TFT can be obtained without degrading the response characteristics of the TFT. This makes it easier to conduct the photolithographic process for the source electrode 112 and the drain electrode 113.

Because μc-Si(n$^+$) is used for the contact layers 114 and 115, it is also possible to form the source electrode 112 and the drain electrode 113 at positions displaced from each other via the channel region of the TFT in the channel width direction so as not to face each other. This contributes in further reducing the patterning margins. Moreover, since no margin for overlap of the source electrode 112 and the drain electrode 113 with the gate electrode 111 is required, the gate electrode 111 can be made smaller. As a result, the parasitic capacitance of the TFT can be reduced. It is also possible to fabricate a TFT with a smaller channel length by a photolithographic technique with a conventional level of precision.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A thin film transistor comprising:

a substrate;

a gate electrode formed on said substrate;

a semiconductor layer insulated from said gate electrode, said semiconductor layer being formed above said substrate to cover said gate electrode;

a first contact layer and a second contact layer which are made of n-type microcrystalline silicon having a resistivity of 10 Ωcm of less, each of said first and second contact layers having a top surface and a bottom surface, one of the top surface and the bottom surface being in contact with said semiconductor layer to cover part of said gate electrode, an outer edge of each of the first and second contact layers being in alignment with an outer edge of the semiconductor layer;

a source electrode which is in contact with part of the other of the top surface and the bottom surface of said first contact layer; and a drain electrode which is in contact with part of the other of the top surface and the bottom surface of said second contact layer, wherein at least one of said source and drain electrodes is disposed not to overlap said gate electrode, wherein a width in a channel width direction of at least one of said source and drain electrodes is smaller than a width in the channel width direction of said first and second contact layers, and wherein said width in the channel width direction of said at least one of said source and drain electrodes is determined so that an end of said at least one of said source and drain electrodes is located apart from an end of a corresponding one of said first and second contact layers by a distance of 3 μm or more.

2. A thin film transistor comprising:

a substrate;

a gate electrode formed on said substrate;

a semiconductor layer insulated from said gate electrode, said semiconductor layer being formed above said substrate to cover said gate electrode;

a first contact layer and a second contact layer which are made of n-type microcrystalline silicon having a resistivity of 10 Ωcm of less, each of said first and second contact layers having a top surface and a bottom surface, one of the top surface and the bottom surface being in contact with said semiconductor layer to cover part of said gate electrode, an outer edge of each of the first and second contact layers being in alignment with an outer edge of the semiconductor layer;

a source electrode which is in contact with part of the other of the top surface and the bottom surface of said first contact layer; and a drain electrode which is in contact with part of the other of the top surface and the bottom surface of said second contact layer, wherein at least one of said source and drain electrodes is disposed not to overlap said gate electrode, wherein a width in a channel width direction of at least one of said source and drain electrodes is smaller than a width in the channel width direction of said first and second contact layers, and wherein said source electrode and said drain electrode are formed at positions displaced from each other in the channel width direction.

3. A thin film transistor comprising:

a substrate;

a gate electrode formed on said substrate;

a semiconductor layer insulated from said gate electrode, said semiconductor layer being formed above said substrate to cover said gate electrode;

a first contact layer and a second contact layer which are made of n-type microcrystalline silicon having a resistivity of 10 Ωcm of less, each of said first and second contact layers having a top surface and a bottom surface, one of the top surface and the bottom surface being in contact with said semiconductor layer to cover part of said gate electrode, an outer edge of each of the first and second contact layers being in alignment with an outer edge of the semiconductor layer;

a source electrode which is in contact with part of the other of the top surface and the bottom surface of said first contact layer; and a drain electrode which is in contact with part of the other of the top surface and the bottom surface of said second contact layer, wherein at least one of said source and drain electrodes is disposed not to overlap said gate electrode, wherein a width in a channel width direction of at least one of said source and drain electrodes is smaller than a width in the channel width direction of said first and second contact layers, and wherein said gate electrode includes a first portion and a second portion directly under the semiconductor layer, said first portion having a first width in a channel length direction, and said second portion having a second width in the channel length direction which is smaller than said first width.

4. A thin film transistor comprising:

a substrate;

a source electrode and a drain electrode both formed on said substrate;

a first contact layer and a second contact layer which are made of n-type microcrystalline silicon having a resistivity of 10 Ωcm or less, said first contact layer being in contact with part of said source electrode, and said second contact layer being in contact with part of said drain electrode;

a semiconductor layer which is in contact with said first and second contact layers, an outer edge of the semiconductor layer being in alignment with an outer edge of each of the first and second contact layers; and a gate electrode insulated from said semiconductor layer, said gate electrode covering part of said first contact layer and part of said contact layer;

wherein said width in the channel width direction of said at least one of said source and drain electrodes is determined so that an end of said at least one of said source and drain electrodes is located apart from an end of a corresponding one of said first and second contact layers by a distance of 3 μm or more;

wherein said source electrode and said drain electrode are formed at positions displaced from each other in the channel width direction; and wherein said semiconductor layer is formed directly on said substrate, said first and second contact layers are formed directly on said semiconductor layer, and said source electrode and said drain electrode are formed to cover part of said first contact layer and part of said second contact layer, respectively.

5. A thin film transistor comprising:

a substrate, a gate electrode formed on said substrate;

a semiconductor layer insulated from said gate electrode, said semiconductor layer being formed above said substrate to cover said gate electrode;

a first contact layer and a second contact layer which are made of n-type microcrystalline silicon having a resistivity of 10 Ωom or less, each of said first and second contact layers having a top surface and a bottom surface, one of the top surface and the bottom surface being in contact with said semiconductor layer to cover part of said gate electrode, an outer edge of each of the first and second contact layers being in alignment with an outer edge of the semiconductor layer;

a source electrode which is in contact with part of the other of the top surface and the bottom surface of said first contact layer; and a drain electrode which is in contact with part of the other of the top surface and the bottom surface of said second contact layer, wherein a width in a channel width direction of at least one of said source and drain electrodes is smaller than a width in the channel width direction of said first and second contact layers, said gate electrode includes a first portion and a second portion under the semiconductor layer, said first portion having a first width in a channel length direction, and said second portion having a second width in the channel length direction which is smaller than said first width, wherein said source electrode and said drain electrode cover part of said first portion of said gate electrode.

6. A thin film transistor comprising:

a substrate;

a gate electrode formed on said substrate;

a semiconductor layer insulated from said gate electrode, said semiconductor layer being formed above said substrate to cover said gate electrode;

a first contact layer and a second contact layer which are made of n-type microcrystalline silicon having a resistivity of 10 $\Omega$cm or less, each of said first and second contact layers having a top surface and a bottom surface, one of the top surface and the bottom surface being in contact with said semiconductor layer to cover part of said gate electrode, an outer edge of each of the first and second contact layers being in alignment with an outer edge of the semiconductor layer;

a source electrode which is in contact with part of the other of the top surface and the bottom surface of said first contact layer;

a drain electrode which is in contact with part of the other of the top surface and the bottom surface of said second contact layer, wherein said source electrode covers part of said first contact layer, and said drain electrode covers part of said second contact layer, and wherein each of said source and drain electrodes includes a first portion and a second portion, said first portion having a first width in a channel width direction, said second portion having a second width in the channel width direction which is larger than said first width, and wherein said first portion partially covers said gate electrode.

* * * * *